(12) United States Patent
Gangasani et al.

(10) Patent No.: US 10,685,707 B2
(45) Date of Patent: Jun. 16, 2020

(54) MEMORY DEVICE

(71) Applicant: Samsung Electronics Co., Ltd., Suwon-si, Gyeonggi-do (KR)

(72) Inventors: Venkataramana Gangasani, Suwon-si (KR); Tae Hui Na, Seoul (KR); Bilal Ahmad Janjua, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/379,148

(22) Filed: Apr. 9, 2019

(65) Prior Publication Data

US 2020/0090745 A1 Mar. 19, 2020

(30) Foreign Application Priority Data

Sep. 17, 2018 (KR) .................. 10-2018-0110822

(51) Int. Cl.
*G11C 8/10* (2006.01)
*G11C 16/06* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0028* (2013.01)

(58) Field of Classification Search
CPC ..... G11C 13/0069; G11C 8/10; G11C 13/004; G11C 16/08; G11C 13/0023; G11C 29/023; G11C 11/4087; G11C 16/06; G11C 16/10; G11C 13/0004; G11C 2213/79; G11C 7/12; G11C 11/1675; G11C 16/24; G11C 2213/76; G11C 8/14; G11C 17/18; G11C 7/22
See application file for complete search history.

(56) References Cited

U.S. PATENT DOCUMENTS

| 7,245,526 | B2 | 7/2007 | Oh et al. | |
|---|---|---|---|---|
| 7,248,494 | B2 | 7/2007 | Oh et al. | |
| 8,270,240 | B2 | 9/2012 | Lin et al. | |
| 8,331,177 | B2 | 12/2012 | Sasaki | |
| 8,675,413 | B2 | 3/2014 | Baker | |
| 9,455,032 | B2 | 9/2016 | Kang | |
| 2002/0001217 | A1* | 1/2002 | Aritomi | G11C 8/10 365/63 |
| 2005/0169095 | A1* | 8/2005 | Bedeschi | G11C 7/12 365/232 |

(Continued)

*Primary Examiner* — Hien N Nguyen
(74) *Attorney, Agent, or Firm* — Harness, Dickey and Pierce, P.L.C.

(57) ABSTRACT

A memory device includes a plurality of memory cells connected to a plurality of word lines and a plurality of bit lines, each of the plurality of memory cells including a switching element and an information storage element connected to the switching element and containing a phase-change material, a decoder unit configured to determine a selected word line and a selected bit line connected to a selected memory cell to read data, among the plurality of memory cells, and a current compensation circuit configured to remove a leakage current from the selected word line, the leakage current corresponding to a sun of off-currents flowing in unselected bit lines, excluding the selected bit line, among the plurality of bit lines, from the selected word line.

20 Claims, 16 Drawing Sheets

(56) References Cited

U.S. PATENT DOCUMENTS

| | | | |
|---|---|---|---|
| 2007/0070703 A1* | 3/2007 | Tran | G11C 8/10 |
| | | | 365/185.22 |
| 2009/0262596 A1* | 10/2009 | Bollu | G11C 8/08 |
| | | | 365/230.06 |
| 2011/0157978 A1* | 6/2011 | Shinozaki | G11C 16/0483 |
| | | | 365/185.02 |
| 2016/0196876 A1* | 7/2016 | Lee | G11C 13/0026 |
| | | | 365/63 |

* cited by examiner

MEMORY DEVICE

CROSS-REFERENCE TO RELATED APPLICATION(S)

This application claims benefit of priority to Korean Patent Application No. 10-2018-0110822 filed on Sep. 17, 2018 in the Korean Intellectual Property Office, the disclosure of which is incorporated herein by reference in its entirety.

BACKGROUND

1. Field

At least some example embodiments relate to a memory device.

2. Description of Related Art

A memory device using a resistor includes a phase-change random access memory (PRAM) device, a resistive random access memory (ReRAM) device, a magnetic RAM (MRAM) device, and the like. Unlike a dynamic random access RAM (DRAM) device, which records data in a manner of charging or discharging charges, a memory device using a resistor may record or erase data using a change in resistance.

SUMMARY

At least some example embodiments provide a memory device capable of improving performance of a reading operation by efficiently removing a leakage current.

A memory device according to an example embodiment includes a plurality of memory cells connected to a plurality of word lines and a plurality of bit lines, each of the plurality of memory cells including a switching element and an information storage element connected to the switching element, the information storage element containing a phase-change material; a decoder circuit configured to read data from a selected memory cell among the plurality of memory cells, the selected memory cell being connected to a selected word line of the plurality of word lines and a selected bit line of the plurality of bit lines; and a current compensation circuit configured to remove a leakage current from the selected word line, the leakage current being based on off-currents flowing in unselected bit lines excluding the selected bit line, among the plurality of bit lines.

A memory device according to an example embodiment includes a plurality of memory cells connected to a plurality of bit lines and a plurality of word lines; a first decoder circuit configured to determine a selected bit line and unselected bit lines among the plurality of bit lines; a second decoder circuit configured to determine a selected word line and unselected word lines among the plurality of word lines; a sense amplifier including an input terminal connected to the selected word line; and a current compensation circuit including, a first transistor connected between a first power node and the unselected bit lines, a second transistor connected to the first power node, the second transistor controlled by a same control signal as the first transistor, a third transistor connected between the second transistor and a second power node, and a fourth transistor connected between the input terminal of the sense amplifier and the second power node, the fourth transistor configured to mirror a current of the third transistor.

A memory device according to an example embodiment includes a plurality of memory cells connected to a plurality of bit lines and a plurality of word lines, the plurality of bit lines including a selected bit line and unselected bit lines excluding the selected bit line; a decoder circuit configured to precharge a selected word line among the plurality of word lines for a first time period, and to connect the selected word line to a current path for a second time period, subsequent to the first time period; a bleeding circuit configured to provide the current path drawing a leakage current from the selected word line for the second time period, the leakage current corresponding to a sum of off-currents flowing in the unselected bit lines; and a sense amplifier configured to compare a sensing voltage detected through the selected word line with a reference voltage for a third time period, the third time period being subsequent to the second time period.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
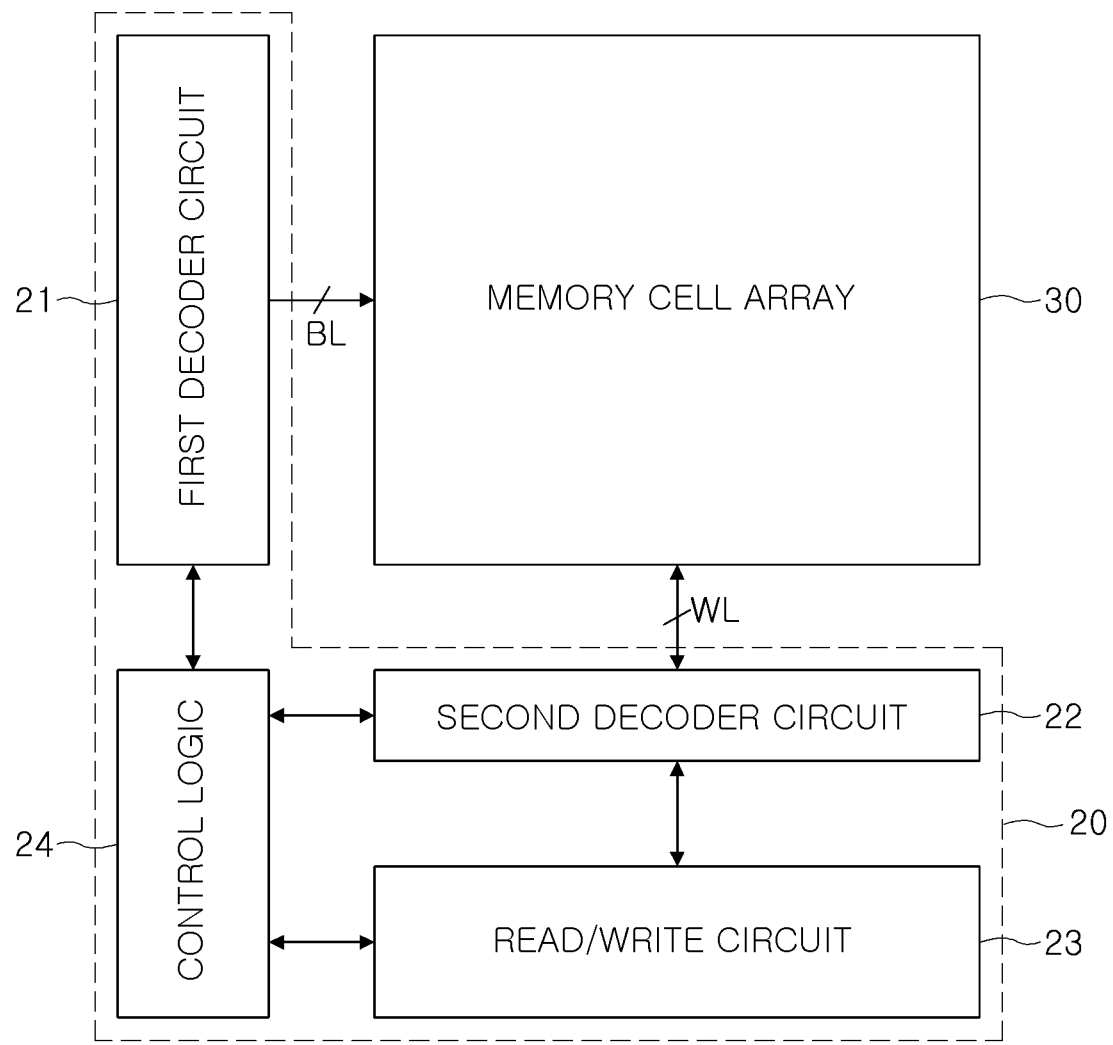
FIG. 1 is a block diagram briefly illustrating a memory device according to an example embodiment of the present inventive concepts.
Figure 2:
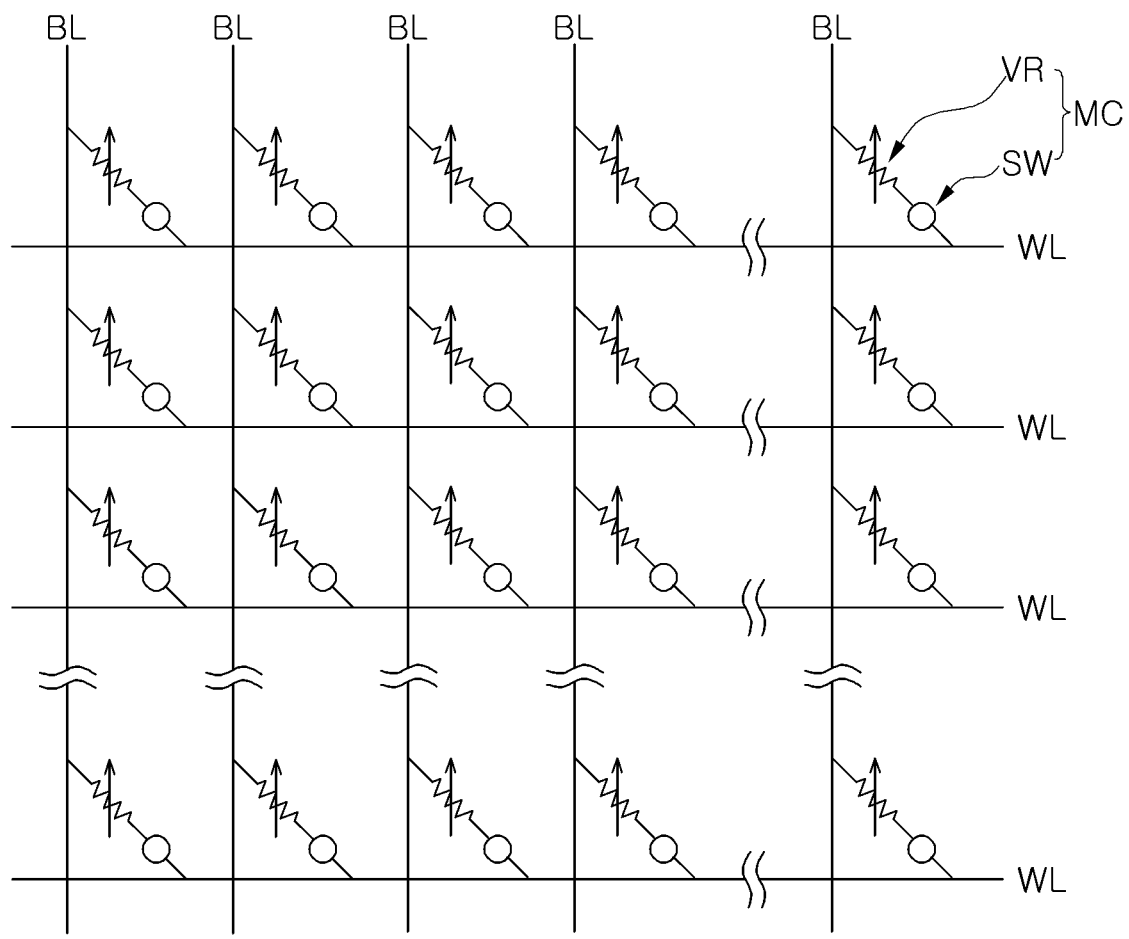
FIG. 2 is a diagram briefly illustrating a memory cell array included in a memory device according to an example embodiment of the present inventive concepts.

FIG. 1 is a block diagram briefly illustrating a memory device according to an example embodiment of the present inventive concepts. FIG. 2 is a diagram briefly illustrating a memory cell array included in a memory device according to an example embodiment of the present inventive concepts.

Referring to FIG. 1, a memory device 10 according to an example embodiment of the present inventive concepts may include a memory controller 20 and a memory cell array 30. The memory controller 20 may include decoder circuits 21 and 22, a read/write circuit 23, a control logic 24, and the like.

The memory cell array 30 may include a plurality of memory cells. The decoder circuits 21 and 22 may include a first decoder circuit 21 connected to a plurality of memory cells via a bit line BL and a second decoder circuit 22 connected to a plurality of memory cells via a word line WL. Operations of the first decoder circuit 21 and the second decoder circuit 22 and the read/write circuit 23 may be controlled by the control logic 24. In an example embodiment, the read/write circuit 23 may write data to at least one selected memory cell specified by the first decoder circuit 21 and the second decoder circuit 22 or read data from the selected memory cell.

Referring to FIG. 2, the memory cell array 30 according to an example embodiment of the present inventive concepts may include a plurality of memory cells MC. The plurality of memory cells MC may be provided at an intersection point of the bit line BL and the word line WL. In other words, each of the plurality of memory cells MC may be connected to one bit line BL and one word line WL.

For example, each of the plurality of memory cells MC may include a switch element SW and an information storage element VR. In an example embodiment, the switch element SW may include at least one of a PN junction diode, a Schottky diode, and an ovonic threshold switch (OTS). Further, in an example embodiment, the information storage element VR may be formed of a phase-change material including a chalcogenide material, a super-lattice, and the like. In other words, the information storage element VR may include a phase-change material capable of phase transitions between an amorphous phase and a crystalline phase depending a heating time, a temperature, and the like. The information storage element VR and the switch element SW may be connected in series with each other.

The memory controller 20 may record or erase data, by phase-transitioning the phase-change material of the information storage element VR included in each of the plurality of memory cells MC into an amorphous phase or a crystalline phase via the bit line BL and the word line WL. In an example embodiment, the memory controller 20 may increase the resistance of the information storage element VR by phase-transitioning the phase-change material of the information storage element VR included in the memory cell MC into an amorphous phase, and may record data. Conversely, the memory controller 20 may reduce the resistance of the information storage element VR by phase-transitioning the phase-change material of the information storage element VR included in the memory cell MC into a crystalline phase, and may erase data. A relationship between the resistance value of the information storage element VR and whether data is recorded may be defined differently. On the other hand, the memory controller 20 may perform a reading operation reading data from a plurality of memory cells MC, by comparing the reading voltage detected from the plurality of memory cells MC with a desired (or, alternatively, a predetermined) reference voltage.

Figure 3:
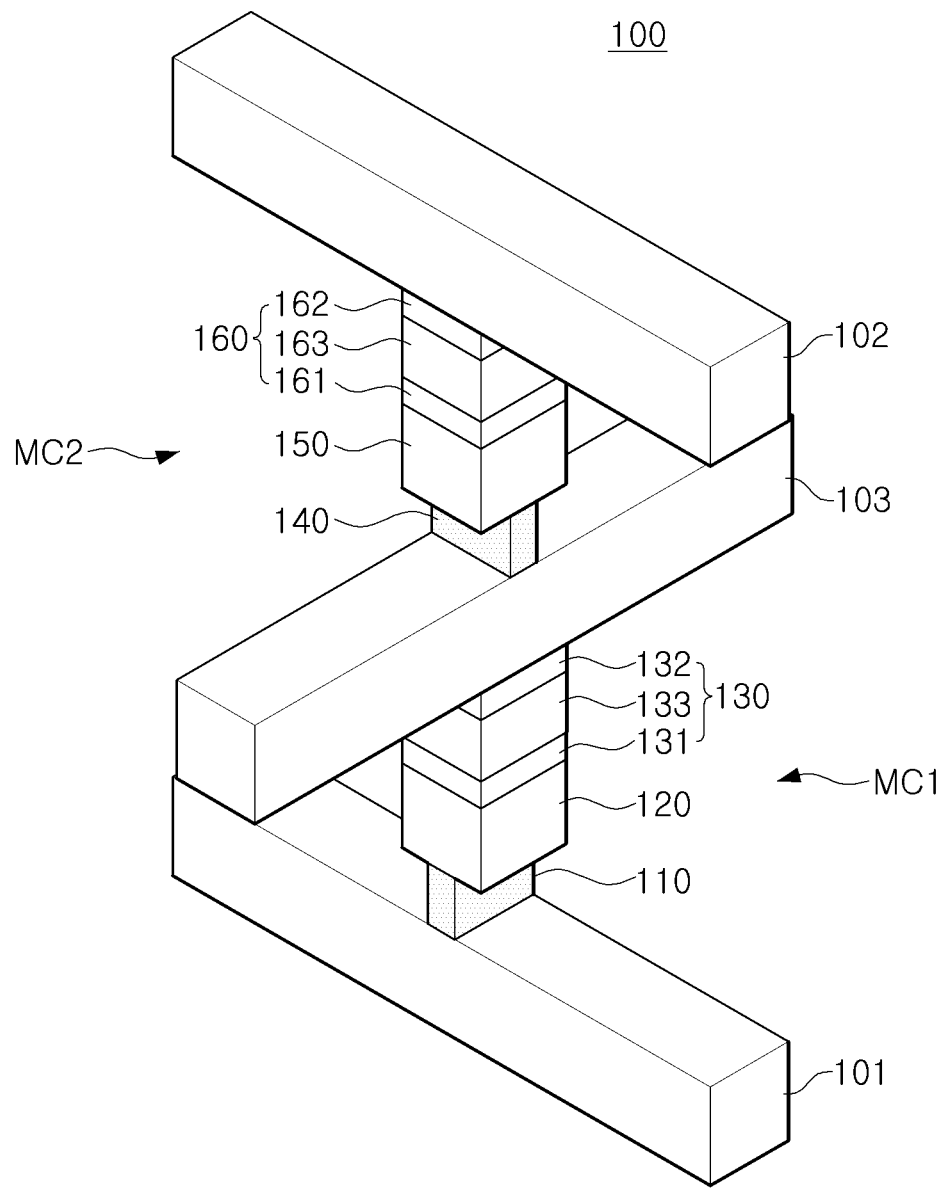
FIG. 3 is a diagram briefly illustrating a structure of a memory cell included in a memory device according to an example embodiment of the present inventive concepts.

FIG. 3 is a diagram briefly illustrating a structure of a memory cell included in a memory device according to an example embodiment of the present inventive concepts.

Referring to FIG. 3, a memory device 100 according to an example embodiment of the present inventive concepts may include a first memory cell MC1 and a second memory cell MC2, provided between a plurality of conductive lines 101 to 103. The first memory cell MC and the second memory cell MC2 may operate as independent memory cells, respectively. For example, when a first conductive line 101 and a third conductive line 103 are word lines, a second conductive line 102 may be a bit line. In addition, when the first conductive line 101 and the third conductive line 103 are bit lines, the second conductive line 102 may be a word line. Hereinafter, for convenience of explanation, the description will be given on the assumption that the first conductive line 101 and the third conductive line 103 are a first word line and a second word line, respectively.

The first memory cell MC1 may include a first heating electrode 110, a first information storage element 120, a first switch element 130, and the like. The first switch element 130 may include a first switch electrode 131, a second switch electrode 132, a first selection layer 133 disposed therebetween, and the like. In an example embodiment, the first selection layer 133 may include an ovonic threshold switch (OTS) material. When a voltage higher than a threshold voltage is applied between the first switch electrode 131 and the second switch electrode 132, a current may flow through the first selection layer 133.

The first information storage element 120 may include a phase-change material, and in an example embodiment, may include a chalcogenide material. For example, the first information storage element 120 may include a Ge—Sb—Te GST, and a crystallization temperature, a melting point, a phase-change speed depending on a crystallization energy, and the like of the first information storage element 120 may be determined according to the kind of elements included in the first information storage element 120 and a chemical composition ratio thereof.

The second memory cell MC2 may have a structure similar to that of the first memory cell MC1. For example, the second memory cell MC2 may include a second heating electrode 140, a second information storage element 150, a second switch element 160, and the like. Respective structures and characteristics of the second heating electrode 140, the second information storage element 150, and the second switch element 160 may be similar to those of the first heating electrode 110, the first information storage element 120, and the first switch element 130. Hereinafter, a method of recording and erasing data with reference to the first memory cell MC1 as an example will be described.

When a voltage is supplied through the first word line 101 and the bit line 103, a joule heat may occur at an interface between the first heating electrode 110 and the first information storage element 120. The phase-change material constituting the first information storage element 120 may be changed from an amorphous phase to a crystalline phase or from a crystalline phase to an amorphous phase. The first information storage element 120 may have a high resistance in the amorphous phase and a low resistance in the crystalline phase. In an example embodiment, data '0' or '1' may be defined according to the resistance value of the first information storage element 120.

To record data to the first memory cell MC1, a programming voltage may be supplied through the first word line 101 and the bit line 103. The programming voltage is higher than a threshold voltage of the ovonic threshold switch material, such that a current may flow through the first switch element 130. The phase-change material included in the first information storage element 120 may be changed from an amorphous phase to a crystalline phase by the programming voltage, and thus, data may be recorded in a first memory area. In an example embodiment, when the phase-change material included in the first information storage element 120 has a crystalline phase, a state of the first memory cell MC1 may be defined as a set state.

On the other hand, to erase data recorded in the first memory cell MC1, the phase-change material included in the first information storage element 120 may be returned from the crystalline phase to the amorphous phase. For example, a desired (or, alternatively, a predetermined) erase voltage may be supplied through the first word line 101 and the bit line 103. By the erase voltage, the phase-change material included in the first information storage element 120 may be changed from a crystalline phase to an amorphous phase. When the phase-change material included in the first information storage element 120 has an amorphous phase, the state of the first memory cell MC1 may be defined as a reset state. For example, a maximum value of the erase voltage may be higher than a maximum value of the programming voltage, and a time to which the erase voltage is supplied may be shorter than a time to which the programming voltage is supplied.

As described above, the resistance values of information storage elements 120 and 150 may be changed according to the state of the phase-change material included in the information storage elements 120 and 150, and the memory controller may distinguish data '0' and '1' from the resistances of the information storage elements 120 and 150. Therefore, the greater the difference in resistance between the information storage elements 120 and 150, which is indicated according to the state of the phase-change material included in the information storage elements 120 and 150, the more accurately the data may be recorded or read by the memory controller.

Figure 4:
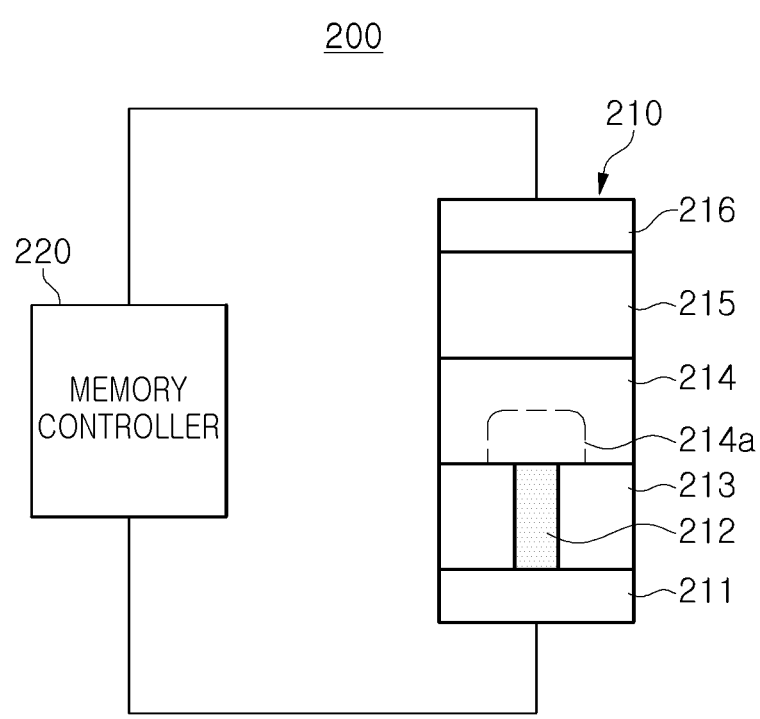
FIG. 4 is a diagram illustrating an operation of a memory device according to an example embodiment of the present inventive concepts.

FIG. 4 is a diagram illustrating an operation of a memory device according to an example embodiment of the present inventive concepts.

Referring to FIG. 4, a memory device 200 according to an example embodiment of the present inventive concepts may be operated by a power which a memory controller 220 supplies to a memory cell 210.

The memory cell 210 may include a lower electrode 211, a heating electrode 212, an information storage electrode 214, a switch element 215, an upper electrode 216, and the like. The lower electrode 211 and the upper electrode 216 may receive a voltage output from the memory controller 220 through a word line or a bit line. An insulating layer 213 may be provided around the heating electrode 212, and a phase-change by a power supplied by the memory controller 220 may occur, in a portion of areas 214a of the information storage element 214 adjacent to the heating electrode 212.

In an example embodiment, a reading operation for determining data of the memory cell 210 may be performed by inputting a desired (or, alternatively, a predetermined) bias voltage to each of the lower electrode 211 and the upper electrode 216. To inhibit (or, alternatively, prevent) an unintentional state change of the information storage element 214 from occurring in the memory cell 210 by the reading operation, a current flowing in the memory cell 210 may be lower than a current flowing during a program operation. For example, the memory controller 220 may input a relatively high first voltage to the upper electrode 216 and a relatively low second voltage to the lower electrode 211 to detect the reading voltage according to the resistance value of the memory cell 210. The memory controller 220 may compare the reading voltage with a desired (or, alternatively, a predetermined) reference voltage to determine the state of the memory cell 210 as the set or reset state.

Figure 5A:
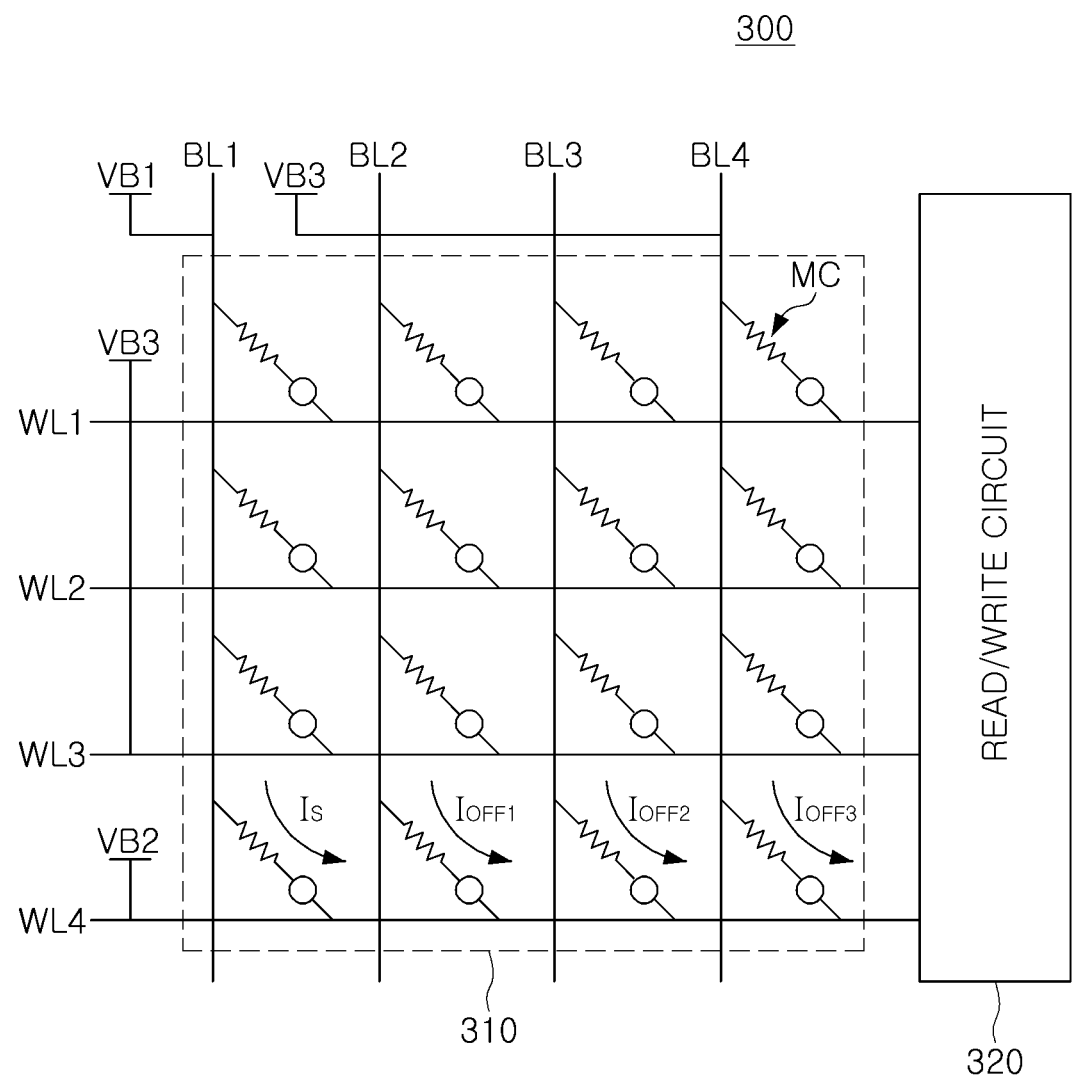
FIGS. 5A and 5B are diagrams illustrating a reading operation of a memory device according to an example embodiment of the present inventive concepts.
Figure 5B:
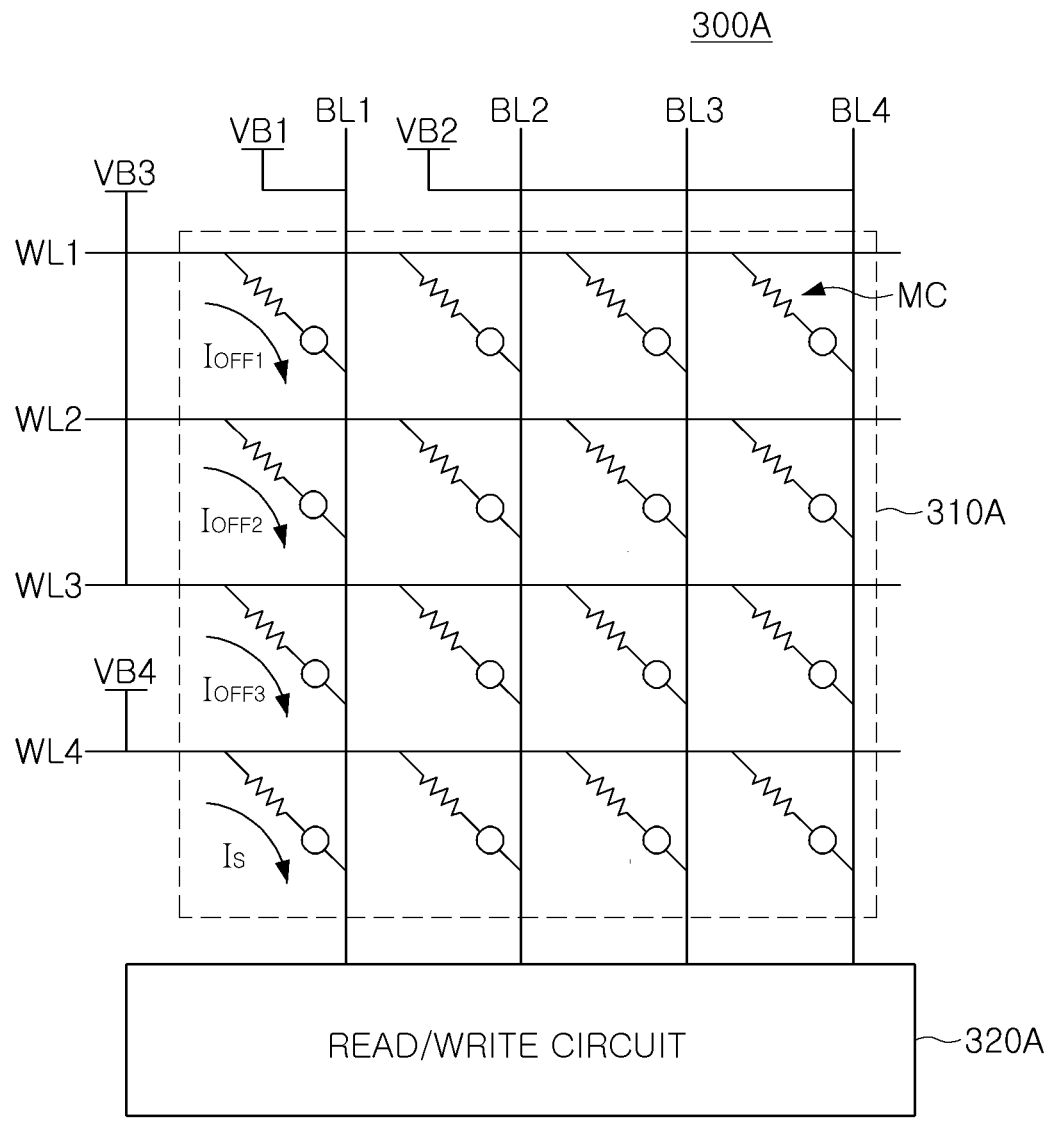

FIGS. 5A and 5B are diagrams illustrating a reading operation of a memory device according to an example embodiment of the present inventive concepts.

First, referring to FIG. 5A, a memory device 300 according to an example embodiment of the present inventive concepts may include a memory cell array 310 and a read/write circuit 320. The memory cell array 310 may include first to fourth bit lines BL1 to BL4, first to fourth word lines WL1 to WL4, and a plurality of memory cells MC. The plurality of memory cells MC may be provided at points at which the first to fourth bit lines BL1 to BL4 intersect with the first to fourth word lines WL1 to WL4.

In an example embodiment illustrated in FIG. 5A, a read/write circuit may read data from a selected memory cell connected to the first bit line BL1 and the fourth word line WL4. The first bit line BL1 connected to the selected memory cell may receive a first voltage VB1 as the selected bit line, and the fourth word line WL4 connected to the selected memory cell may receive the second voltage VB2 as the selected word line. On the other hand, a third voltage VB3 may be input to the second to fourth bit lines BL2 to BL4 and the first to third word lines WL1 to WL3, which are not connected to the selected memory cell.

For example, the first voltage VB1 may be higher than the second voltage VB2, and the third voltage VB3 may be lower than the first voltage VB1 and higher than the second voltage VB2. Thus, the voltage difference applied to the selected memory cell may be greater than the voltage difference applied to the unselected memory cell, and ideally a current may flow only through the selected memory cell. The read/write circuit 320 may determine the state of the selected memory cell as the set or reset state by generating a reading voltage from a sensing current $I_S$ flowing in the selected memory cell and the fourth word line WL4 and comparing the reading voltage with a desired (or, alternatively, a predetermined) reference voltage.

However, in an actual reading operation of the memory device 300, off-currents $I_{OFF1}$ to $I_{OFF3}$ flowing from each of the second to fourth bit lines BL2 to BL4, which are unselected bit lines, to the fourth word line WL4, which is a selected word line, may occur. The sum of the off-currents $I_{OFF1}$ to $I_{OFF3}$ may be defined as a leakage current and may flow into the read/write circuit 320 via the fourth word line WL4. When a leakage current occurs, the reading voltage generated from the current flowing in the fourth word line WL4 to read data of the selected memory cell by the read/write circuit 320 may increase. Therefore, the data of the selected memory cell may not be correctly read.

To address the above-described problem, the first voltage VB1 input to the selected bit line may be increased, but this may lead to an increase in power consumption of the memory device 300. In contrast, in one or more example embodiments of the present inventive concepts, the leakage current corresponding to the sum of the off-currents $I_{OFF1}$ to $I_{OFF3}$ at the current input from the selected word line to the read/write circuit 320 may be removed. Thus, the accuracy of the reading operation of the memory device 300 may be improved without increasing the power consumption.

The magnitudes of the bias voltages input to the selected word line and unselected word lines, the selected bit line and unselected bit lines are not necessarily limited as illustrated in FIG. 5A. For example, the magnitudes of the bias voltages input to the selected word line and the unselected word lines, the selected bit line and the unselected bit lines may be different from each other. In other words, unlike the unselected bit lines, the fourth voltage VB4 other the third voltage VB3 may be input to the unselected word lines. At this time, the fourth voltage VB4 may have a magnitude different from the third voltage VB3 and may be a voltage, lower than the first voltage VB1 and higher than the second voltage VB2.

On the other hand, unlike an example embodiment illustrated in FIG. 5A, a read/write circuit may be connected to the bit lines BL1 to BL4. In this case, a bias voltage may be input to each of the selected word line and the unselected word lines, the selected bit line, and the unselected bit lines such that the off-currents $I_{OFF1}$ to $I_{OFF3}$ and the sensing current $I_S$ flow from the word lines WL1 to WL4 to the bit lines BL1 to BL4. Hereinafter, a description will be made with reference to FIG. 5B.

Referring to FIG. 5B, a memory device 300A according to an example embodiment of the present inventive concepts may include a memory cell array 310A and a read/write circuit 320A. The structure of the memory cell array 310A may be similar to that described with reference to FIG. 5A. The plurality of memory cells MC1 may be provided at points at which the first to fourth bit lines BL1 to BL4 intersect with the first to fourth word lines WL1 to WL4.

The read/write circuit 320A may be connected to the first to fourth bit lines BL1 to BL4, in an example embodiment illustrated in FIG. 5B, the read/write circuit 320A may read data from the selected memory cell connected to the first bit line BL1 and the fourth word line WL4. The first bit line BL1 connected to the selected memory cell receives a first voltage VB1 as a selected bit line and the second to fourth bit lines BL2 to BL4, which are the unselected bit lines, may receive a second voltage VB2. On the other hand, the first to third word lines WL1 to WL3 may receive the third voltage VB3 as unselected word lines, and the fourth word line WL4, as the selected word line, may receive the fourth voltage VB4. In an example embodiment, a magnitude relationship of the first to fourth voltages VB1 to VB4 may be defined as the following Equation 1.

$$VB1 < VB3 < VB2 < VB4 \quad [\text{Equation 1}]$$

For example, the first voltage VB1 input to the selected bit line may be a ground voltage, and the fourth voltage VB4 input to the selected word line may be a power voltage VDD. At this time, the second power voltage VB2 may be a ⅔*VDD, and the third power voltage may be a ⅓*VDD. A voltage difference of VDD may be applied to the selected memory cell, and a voltage difference of ⅓*VDD may be applied to the unselected memory cells. Therefore, the selected memory cell may be turned-on and the unselected memory cells may not be turned-on.

However, in the actual reading operation of the memory device 300A, as described with reference to FIG. 5A, off-currents $I_{OFF1}$ to $I_{OFF3}$ flowing from each of the first to third word lines WL1 to WL3 to the first bit line BL1 may occur. The first to third word lines WL1 to WL3 may be unselected word lines which are not selected among the word lines WL1 to WL4, and the first bit line BL1 may be selected bit line which is selected among the bit lines BL1 to BL4. The sum of the off-currents $I_{OFF1}$ to $I_{OFF3}$ may be defined as a leakage current and may flow into the read/write circuit 320A through the first bit line BL1. In an example embodiment of the present inventive concepts, in a total current detected by the read/write circuit 320A through the first bit line BL1, a current compensation circuit to remove the leakage current corresponding to the sum of the off-currents $I_{OFF1}$ to $I_{OFF3}$ may be included in the read/write circuit 320A. Therefore, the accuracy of the reading operation of the memory device 300A may be improved.

Figure 6:
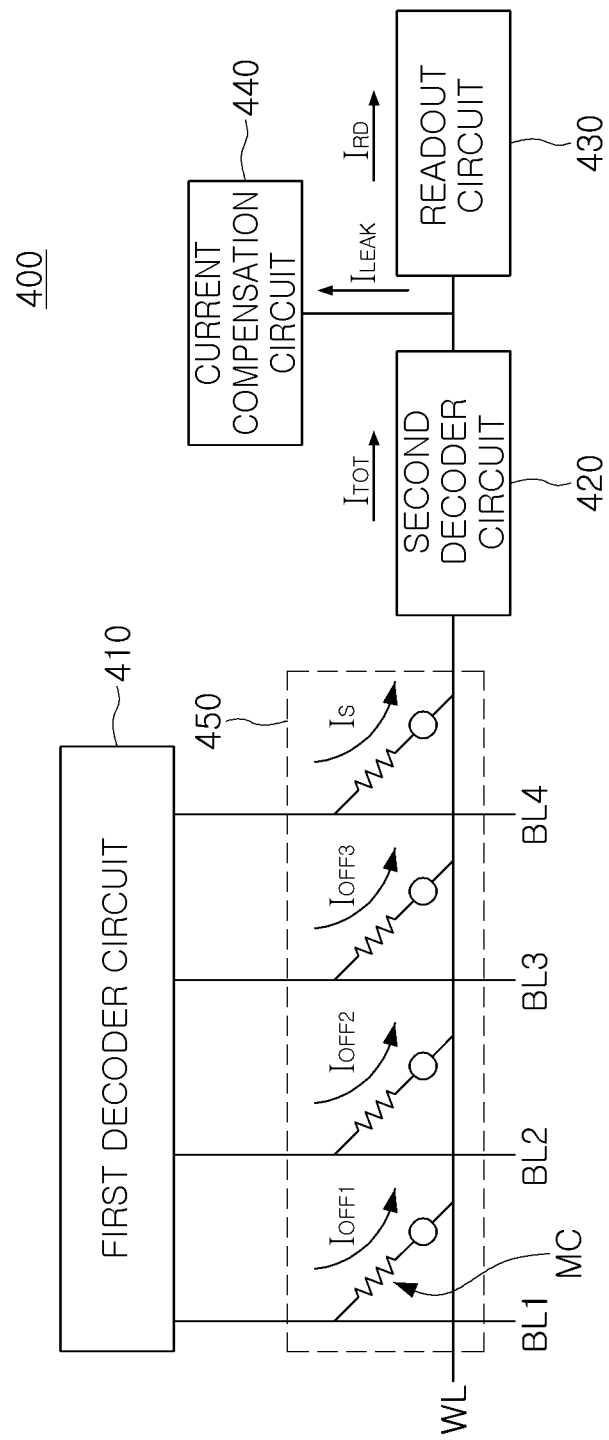
FIG. 6 is a block diagram briefly illustrating a memory device according to an example embodiment of the present inventive concepts.

FIG. 6 is a block diagram briefly illustrating a memory device according to an example embodiment of the present inventive concepts.

Referring to FIG. 6, a memory device 400 according to an example embodiment of the present inventive concepts may include a first decoder circuit 410, a second decoder circuit 420, a readout circuit 430, a current compensation circuit 440, and a memory cell array 450.

The memory cell array 450 may include a plurality of memory cells MC. The first decoder circuit 410 may be connected to the plurality of memory cells MC through the first to fourth bit lines BL1 to BL4, and the second decoder circuit 420 may be connected to the plurality of memory cells MC through the word line WL. For convenience of explanation, only one word line WL is illustrated in an example embodiment of FIG. 6, but the memory cell array 450 may include a plurality of word lines WL. In addition, the number of the bit lines BL1 to BL4 may be variously modified.

In an example embodiment illustrated in FIG. 6, the readout circuit 430 may read data of a selected memory cell connected to the fourth bit line BL4. Thus, the fourth bit line BL4 may be determined to be a selected bit line, and the first to third bit lines BL1 to BL3 may be unselected bit lines. The first decoder circuit 410 may input a first voltage to the fourth bit line BL4 as a bias voltage, and the second decoder circuit 420 may input a second voltage, lower than the first voltage as a bias voltage. In addition, the first decoder circuit 410 may input a third voltage, which is lower than the first voltage and higher than the second voltage. For example, the third voltage may be a voltage of 0V, the first voltage may be a positive voltage, and the second voltage may be a negative voltage. Absolute values of the first voltage and the second voltage may be equal to each other.

When a bias voltage is applied to the bit lines BL1 to BL4 and the word line WL as described above, in an ideal case, a current may flow only in a selected memory cell in which a relatively high voltage difference is generated. The current flowing in the selected memory cell may be a sensing current $I_S$, by detecting a reading voltage corresponding to the sensing current $I_S$ and comparing it with the reference voltage, the state of the selected memory cell may be determined to be a set or a reset state.

However, in an actual operation, a current may flow in each of the unselected memory cells connected to the memory cells, which are not selected, for example, to the first to third bit lines BL1 to BL3. Referring to FIG. 6, the current flowing through the first to three bit lines BL1 to BL3 and the unselected memory cells, and the word line WL may be defined as the first to three off-currents $I_{OFF1}$ to $I_{OFF3}$. The total current $I_{TOT}$ transferred to the second decoder unit 420 may be increased, by adding the off-currents $I_{OFF1}$ to $I_{OFF3}$ to the sensing current $I_S$ through the word line WL. Thus, the readout circuit may not accurately determine the state of the selected memory cell.

In an example embodiment of the present inventive concepts, the above-described problem may be addressed by using a current compensation circuit 440. The current compensation circuit 440 may be connected to an input terminal of the readout circuit 430, and may remove the leakage current $I_{LEAK}$ from the total current $I_{TOT}$ flowing in the word line WL. For example, the leakage current $I_{LEAK}$ may be a current of substantially the same magnitude as the sum of the off-currents $I_{OFF1}$ to $I_{OFF3}$.

The current compensation circuit 440 may include a circuit detecting and mirroring the currents of the first to three bit lines BL1 to BL3, which are unselected bit lines through the first decoder circuit 410, such that the current of substantially the same magnitude as the sum of the off-currents $I_{OFF1}$ to $I_{OFF3}$ may be removed as the leakage current $I_{LEAK}$. A read current $I_{RD}$ input to the readout circuit 430 may have the substantially same magnitude as that of the sensing current $I_S$ flowing through the selected memory cell, by removing the leakage current $I_{LEAK}$ from the total current $I_{TOT}$ by the current compensation circuit 440.

In other words, in an example embodiment of the present inventive concepts, the accuracy of the reading operation may be improved, by compensating the off-currents $I_{OFF1}$ to $I_{OFF3}$ flowing in the unselected memory cells using the current compensation circuit 440. The current compensation circuit 440 may include a circuit for detecting the off-currents $I_{OFF1}$ to $I_{OFF3}$ flowing in the unselected memory cells, a circuit for removing the leakage current $I_{LEAK}$ corresponding to the sum of the off-currents $I_{OFF1}$ to $I_{OFF3}$ from the total current $I_{TOT}$ of the word line WL, and the like. For example, the current compensation circuit 440 may include a bleeding element to draw the leakage current $I_{LEAK}$. The bleeding element may be implemented by a transistor, or the like, and a gate electrode of the transistor providing the bleeding element may be connected to the first decoder circuit 410 controlling the bit lines BL1 to BL4 to draw the leakage current $I_{LEAK}$ corresponding to the sum of the off-currents $I_{OFF1}$ to $I_{OFF3}$.

Figure 7:
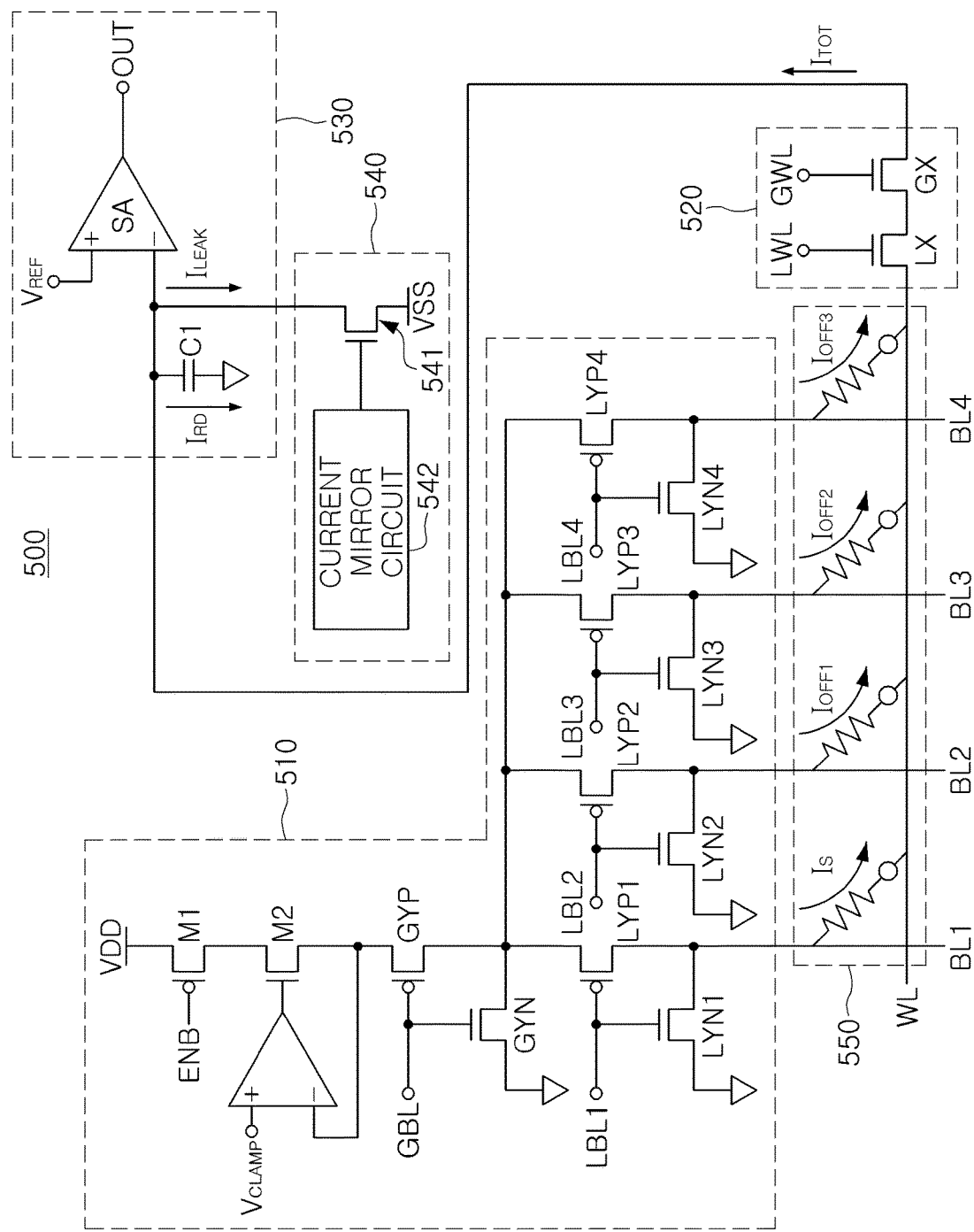
FIG. 7 is a circuit diagram briefly illustrating a memory device according to an example embodiment of the present inventive concepts.

FIG. 7 is a circuit diagram briefly illustrating a memory device according to an example embodiment of the present inventive concepts.

Referring to FIG. 7, a memory device 500 according to an example embodiment of the present inventive concepts may include a first decoder circuit 510, a second decoder circuit 520, a readout circuit 530, a current compensation circuit 540, and a memory cell array 550. As described above with reference to FIG. 6, only one word line WL is illustrated in an example embodiment of FIG. 7, but the memory cell array 550 may include a plurality of word lines WL. In addition, the number of the bit lines BL1 to BL4 may be variously modified.

The first decoder circuit 510 may be connected to the bit lines BL1 to BL4, and may input a bias voltage to each of the bit lines BL1 to BL4 for a control operation such as read/write/erase, and the like. In an example embodiment illustrated in FIG. 7, it is assumed that a reading operation of reading data of the memory cell connected to the first bit line BL1, and the first decoder circuit 510 may define the first bit line BL1 as a selected bit line, and the second to fourth bit lines BL2 to BL4 as unselected bit lines.

Each of the bit lines BL1 to BL4 may be connected to a pair of elements. For example, the first bit line BL1 may be connected to a first selection element LYP1 and a first non-selection element LYN1. The first selection element LYP1 may be turned-on when the first bit line BL1 is defined as a selected bit line, and the first non-selection element LYN1 may be turned-on when the first bit line BL1 is defined as an unselected bit line. The first selection element LYP1 may be a PMOS transistor, and the non-selection element LYN1 may be an NMOS transistor. The gate terminals of the first selection element LYP1 and the first non-selection element LYN1 may simultaneously receive a first bit line control signal LBL1.

On the other hand, the bit lines BL1 to BL4 may share one common selection element GYP and a common non-selection element GYN. The common selection element GYP may be a PMOS transistor, and the common non-selection element GYN may be an NMOS transistor. The gate terminals of the common selection element GYP and the common non-selection element GYN may simultaneously receive the common bit line control signal GBL.

Referring to the second decoder circuit 520, the word line WL may be connected to a pair of elements. Referring to FIG. 7, the word line WL may be connected to an discrete selection element LX and a common selection element GX, and in the case of a plurality of word lines WL, each of the plurality of word lines WL may be connected to different discrete selection elements LX, and the plurality of word lines WL may share the common selection element GX. The common selection element GX may be connected to a first input terminal of a first capacitor C1 and a sense amplifier SA.

The sense amplifier SA may compare a voltage of the first capacitor C with a desired (or, alternatively, a predetermined) reference voltage $V_{REF}$. The sense amplifier SA may include a first input terminal connected to the first capacitor C1 and a second input terminal receiving the reference voltage $V_{REF}$. The first input terminal may be connected to a first current path provided by the second decoder circuit 520 and a word line WL and a second current path provided by the current compensation circuit 540. Since the word line WL providing the first current path is connected to the bit lines BL1 to BL4 through the memory cells, the first input terminal may be connected to unselected bit lines through the word line WL and the memory cells. When the current compensation circuit 540 is activated, a portion of a current charging the first capacitor C1 is drawn by the current compensation circuit 540, such that the voltage of the first input terminal may be reduced. The current compensation circuit 540 may include a bleeding circuit 541 which draws at least a portion of the current charging the first capacitor C1 and a current mirror circuit 542 which determines an amount of current drawn by the bleeding circuit 541.

A magnitude of the current drawn by the bleeding circuit 541, in detail, a magnitude of the current flowing in the second current path may be determined by a current flowing in at least one of the unselected bit lines which is not selected among the bit lines BL1 to BL4. For example, the bleeding circuit 541 may be implemented as a transistor, or the like, and the gate of the transistor may be connected to at least one of the unselected bit lines. Thus, the bleeding circuit 541 may mirror the current corresponding to the magnitude of the current flowing in at least one of the unselected bit lines to flow it to the second current path.

When a reading operation for the selected memory cell connected to the first bit line BL1 and the word line WL is started, the first decoder circuit 510 may use an enable signal ENB and a clamp voltage VCLAMP to turn-on an enable element M1 and a clamp element M2. In addition, the first decoder circuit 510 may turn-on the common selection element GYP and turn-off the common non-selection element GYN, and may turn-on a first selection element LYP1 connected to the first bit line BL1 and turn-off a first non-selection element LYN1. At the same time, the first decoder circuit 510 may turn-on unselected elements LYN2 to LYN4 connected to the second to fourth bit lines BL2 to BL4 and turn-off selected elements LYP2 to LYP4. Thus, the first bit line BL1 may receive a first voltage as a bias voltage, and the second to fourth bit lines BL2 to BL4 may receive a ground voltage as a bias voltage.

On the other hand, the second decoder circuit 520 may turn-on the discrete selection element LX and the common selection element GX to connect the first input terminal of the sense amplifier SA to the word line WL. The second decoder circuit 520 may input a second voltage as a bias voltage, and the second voltage may be a negative voltage lower than the ground voltage. For example, an absolute value of the second voltage may be equal to an absolute value of the first voltage.

Accordingly, a voltage corresponding to a difference between the first voltage and the second voltage may be applied to the selected memory cell connected to the first bit line BL1 and the word line WL. In addition, a voltage equal to a difference between the ground voltage and the second voltage may be applied, to each of the unselected memory cells connected to the second to fourth bit lines BL2 to BL4 and the word line WL. In an ideal case, the first capacitor C1 may be charged only by a sensing current $I_S$ flowing through the selected memory cell, but in an actual operation, the first capacitor C1 may be charged by the total current $I_{TOT}$ in which the off-currents $I_{OFF1}$ to $I_{OFF3}$ flowing through each of the unselected memory cells are added to the word line WL. Thus, the first capacitor C1 may be charged to a higher voltage faster, and the sense amplifier SA may not accurately determine the state of the selected memory cell.

In an example embodiment of the present inventive concepts, the above-described problem may be addressed by using the current compensation circuit 540. For example, the current mirror circuit 542 may detect off-currents $I_{OFF1}$ to $I_{OFF3}$ flowing in the unselected memory cells by the voltage difference between the second to fourth bit lines BL2 to BL4 and the word line WL and mirror a current of substantially the same magnitude as the sum of the off-currents $I_{OFF1}$ to $I_{OFF3}$ to the bleeding circuit 541. The bleeding circuit 541 may remove a leakage current $I_{LEAK}$ corresponding to the sum of the off-currents $I_{OFF1}$ to $I_{OFF3}$ from the first input terminal of the sense amplifier SA. Thus, a read current $I_{RD}$ charging the first capacitor C1 may be substantially equal to the sensing current $I_S$ flowing in the selected memory cell, and the sense amplifier SA may accurately determine the state of the selected memory cell.

Figure 8:
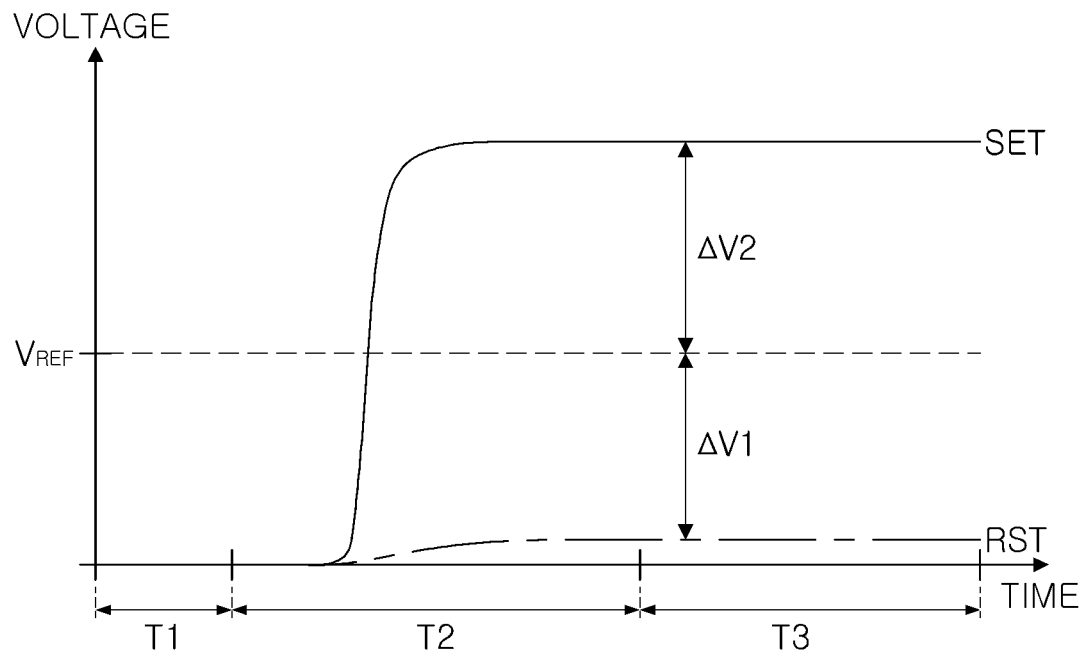
FIGS. 8 to 10 are graphs illustrating a memory device according to an example embodiment of the present inventive concepts.
Figure 9:
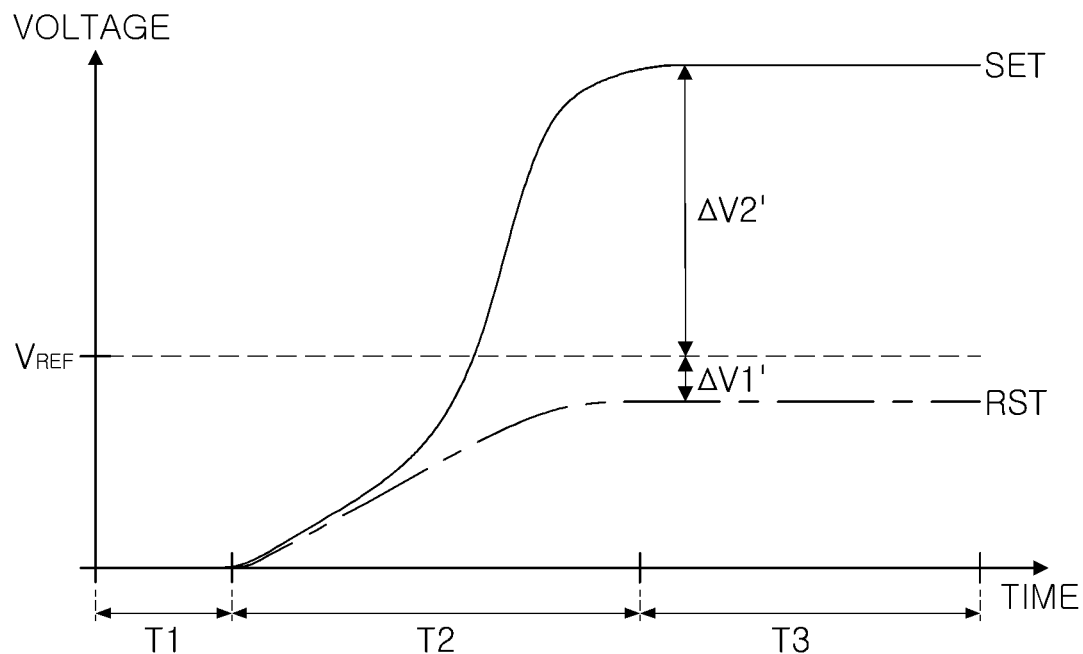
Figure 10:
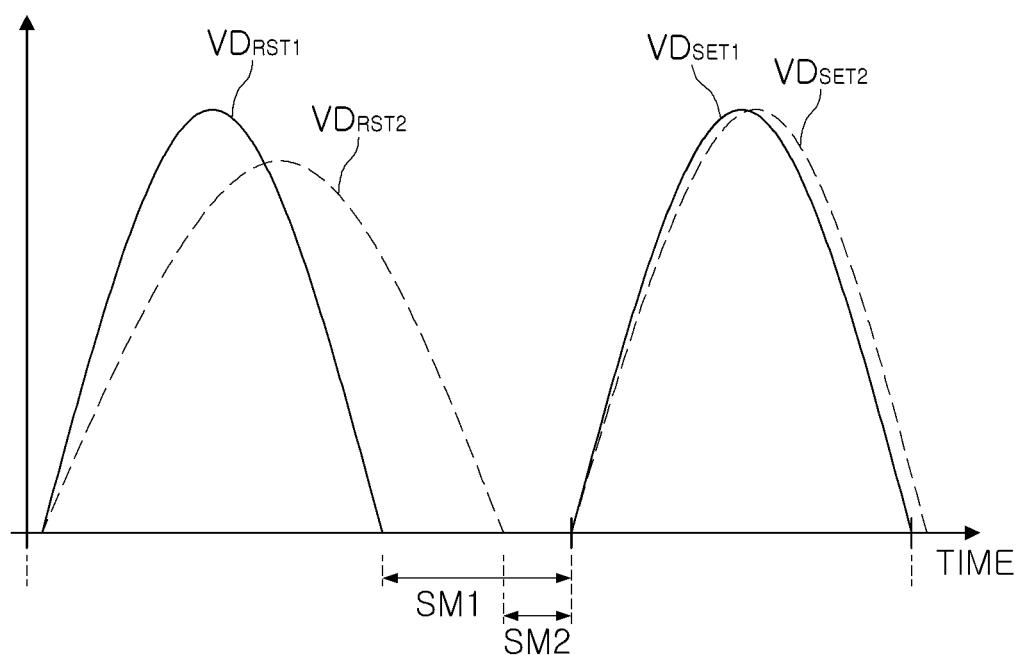

FIGS. 8 to 10 are graphs illustrating a memory device according to an example embodiment of the present inventive concepts. Hereinafter, a memory device 500 illustrated in FIG. 7 will be described together.

FIGS. 8 and 9 may be graphs illustrating a reading operation. FIG. 8 may correspond to an example embodiment in which the leakage current $I_{LEAK}$ is removed by the current compensation circuit 540, and FIG. 9 may correspond to an example embodiment in which the leakage current $I_{LEAK}$ is not removed by the current compensation circuit 540. In the graphs illustrated in FIGS. 8 and 9, a first time T1 may be a pre-charge period inputting a bias voltage to the bit lines BL1 to BL4 and the word line WL, and a second time T2 may be a development period. On the other hand, a third time T3 may be a sensing period in which the sense amplifier SA compares the reading voltage with the reference voltage $V_{REF}$. The current compensation circuit 540 may remove the leakage current $I_{LEAK}$ during the second time T2.

Referring to a graph of FIG. 8 in which the leakage current $I_{LEAK}$ is removed by the current compensation circuit 540, a first margin (ΔV1) may exist when the selected memory cell is in a reset state based on the reference voltage $V_{REF}$, and a second margin (ΔV2) may exist when the selected memory cell is in a set state. A sufficient margin may be secured when the selected memory cell is in the reset state or in the set state based on the reference voltage $V_{REF}$. Therefore, even when there is a noise component, or the like flowing from the outside, the readout circuit 530 may accurately determine the state of the selected memory cell.

On the other hand, referring to the graph of FIG. 9 in which the current compensation circuit 540 does not remove the leakage current $I_{LEAK}$, when a selected memory cell is in a reset state based on the reference voltage $V_{REF}$, a first margin ΔV1' may exist, and when the selected memory cell is in a set state, a second margin ΔV2' may exist. Since a first capacitor C1 is charged by a total current $I_{TOT}$, in which the leakage current $I_{LEAK}$ is added to a sensing current $I_S$, the reading voltage may be increased from an earlier time point than that of the graph illustrated in FIG. 8. In addition, as the reading voltage detected from the selected memory cell in the reset state increases by the leakage current $I_{LEAK}$, the first margin ΔV1" may decrease. Therefore, when there is a noise component, or the like flowing from the outside, a readout circuit 530 may erroneously determine the state of the selected memory cell.

FIG. 10 may be a graph illustrating distribution of the reading voltage read from the memory cells MC of the memory cell array 550 by the readout circuit 530. Referring to FIG. 10, when the current compensation circuit 540 removes the leakage current $I_{LEAK}$, the reading voltage of the memory cells in the reset state may have a first reset distribution $VD_{RST1}$, and the reading voltage in the set state may have a first set distribution $VD_{SET1}$. Therefore, the readout circuit 530 may secure a first sensing margin SM1, and may determine the states of the memory cells by comparing the reading voltage with the reference voltage $V_{REF}$ located at the first sensing margin SM1.

On the other hand, when the current compensation circuit 540 does not remove the leakage current $I_{LEAK}$, the reading voltage of the memory cells in the reset state may have a second reset distribution $VD_{RST2}$, and the reading voltage of the memory cells in the set state may have a second set distribution $VD_{SET2}$. Since the leakage current $I_{LEAK}$ is added to the sensing current $I_S$ of the selected memory cell, the second set distribution $VD_{SET2}$ may have a wider range than the first set distribution $VD_{SET1}$. Thus, a sensing margin of the readout circuit 530 may be reduced to a second sensing margin SM2, and the accuracy of the readout operation may be reduced. In an example embodiment of the present inventive concepts, by removing the leakage current $I_{LEAK}$ from the current compensation circuit 540, the sensing margin may be sufficiently secured and the accuracy of the reading operation may be improved.

Figure 11:
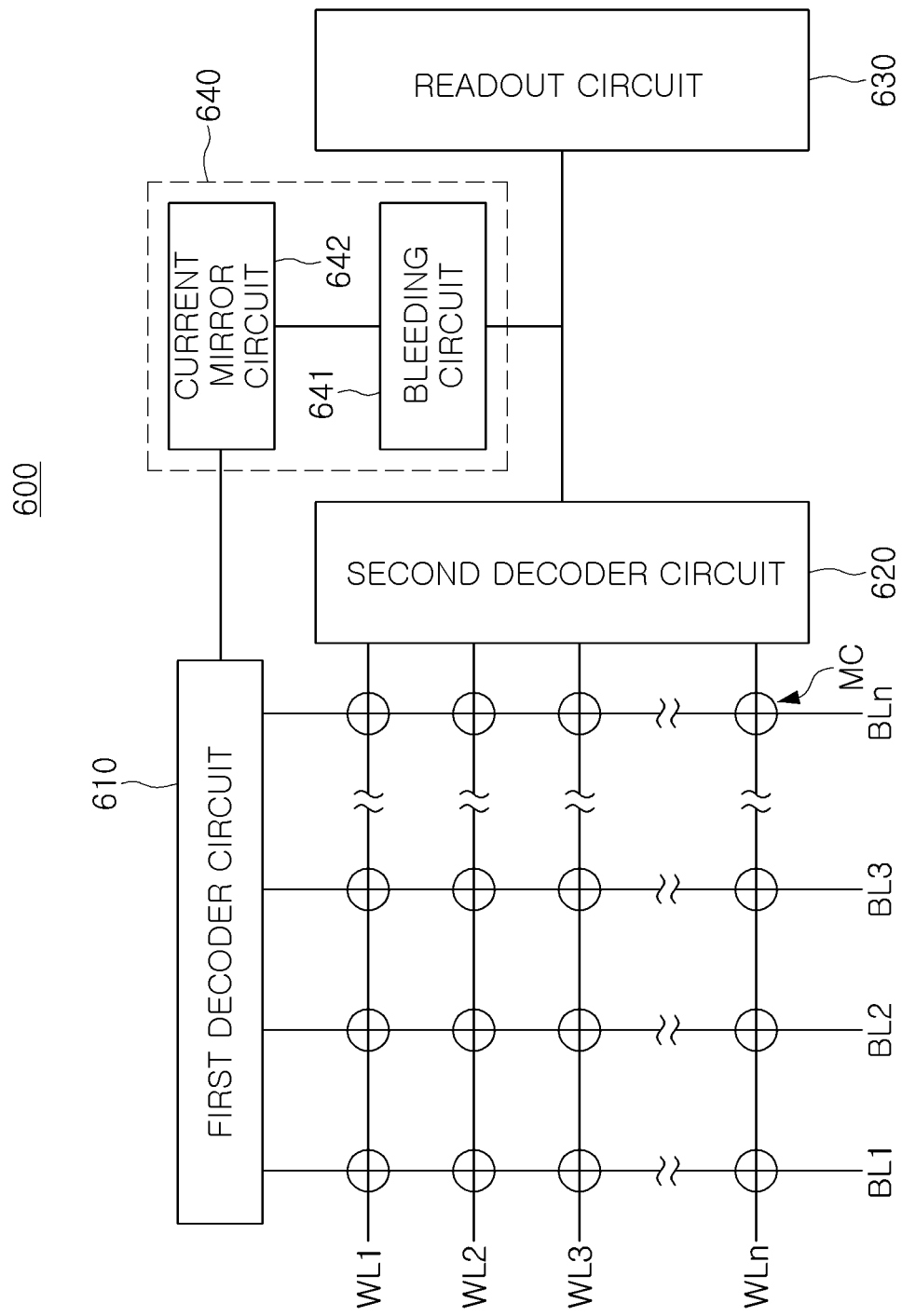
FIG. 11 is a block diagram briefly illustrating a memory device according to an example embodiment of the present inventive concepts.

FIG. 11 is a block diagram briefly illustrating a memory device according to an example embodiment of the present inventive concepts.

Referring to FIG. 11, a memory device 600 according to an example embodiment of the present inventive concepts may include a first decoder circuit 610, a second decoder circuit 620, a readout circuit 630, a current compensation circuit 640, and the like. The first decoder circuit 610 may be connected to a plurality of bit lines BL1 to BLn: BL, and the second decoder circuit 602 may be connected to a plurality of word lines WL1 TO WLm: WL. The plurality of bit lines BL and the plurality of word lines WL may be connected to a plurality of memory cells MC. Operations of the first decoder circuit 610, the second decoder circuit 620, and the readout circuit 630 may be similar to those described above with reference to FIG. 7.

The current compensation circuit 640 may include a bleeding circuit 641 and a current mirror circuit 642. The bleeding circuit 641 may draw at least a portion of the current which the second decoder circuit 620 outputs to the readout circuit 630 to remove. An amount of current drawn by the bleeding circuit 641 may be determined by a magnitude of the current mirrored by the current mirror circuit 642 to the bleeding circuit 641.

Therefore, the current mirror circuit 642 may detect the off-currents which occur during the reading operation for a specific selected memory cell, such that the leakage current corresponding to the sum of the off-currents from the current input to the readout circuit 630 may be removed. The current mirror circuit 640 may be connected to unselected bit lines which are not selected from among the plurality of bit lines BL to detect off-currents flowing from the unselected bit lines to a selected word line.

Figure 12:
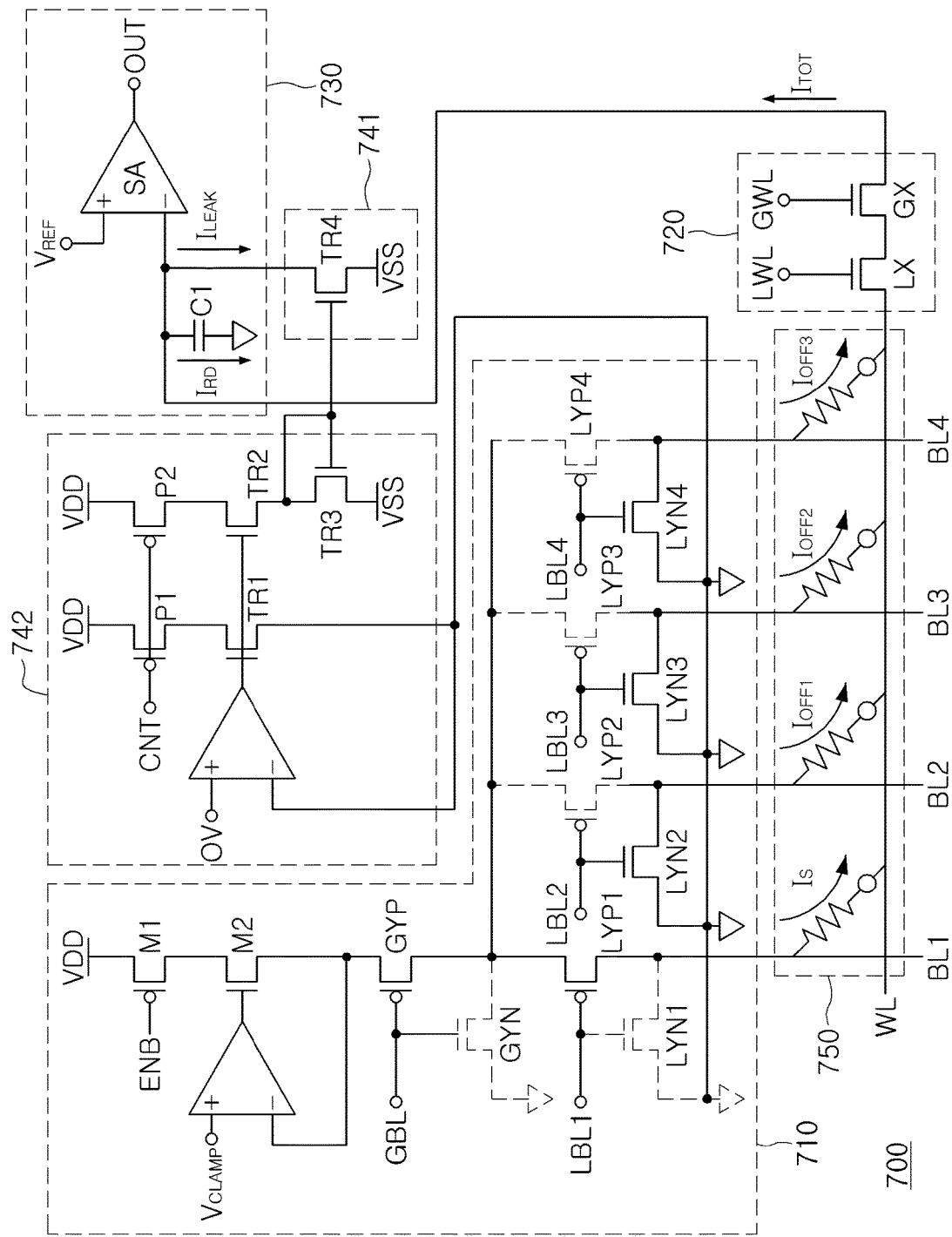
FIG. 12 is a circuit diagram briefly illustrating a memory device according to an example embodiment of the present inventive concepts.

FIG. 12 is a circuit diagram briefly illustrating a memory device according to an example embodiment of the present inventive concepts.

Referring to FIG. 12, a memory device 700 according to an example embodiment of the present inventive concepts may include a first decoder circuit 710, a second decoder circuit 720, a readout circuit 730, current compensation circuits 741 and 742, a memory cell array 750, and the like. Configurations and operations of the first decoder circuit 710, the second decoder circuit 720, and the readout circuit 730 may be similar to those described above with reference to FIG. 7. In addition, the number of bit lines BL1 to BL4 and word line WL is for convenience of explanation, and may be variously modified.

In an example embodiment illustrated in FIG. 12, the first decoder circuit 710 may turn-on a first selection element LYP1 connected to the first bit line BL1 and second to fourth unselected elements LYN2 to LYN4 connected to the second to fourth bit lines BL2 to BL4. Accordingly, the first bit line BL1 may be determined to be a selected bit line, and the second to fourth bit lines BL2 to BL4 may be determined to be unselected bit lines. On the other hand, the second decoder circuit 720 may turn-on a discrete selection element LX and a common selection element GX. Thus, the readout circuit 730 may read data from the selected memory cell connected to the first bit line BL1 and the word line WL.

In an example embodiment, the first bit line BL1 may be biased to a first voltage, and the word line WL may be biased to a second voltage, which is lower than the first voltage. Further, the second to fourth bit lines BL2 to BL4 may be biased to a third voltage, which is lower than the first voltage and higher than the second voltage. For example, the second voltage may be a negative voltage and the third voltage may be a ground voltage, and the absolute values of the first voltage and the second voltage may be equal to each other.

The sensing current $I_S$ generated by the first voltage and the second voltage may flow in the selected memory cell. The magnitude of the sensing current $I_S$ may vary depending on the resistance of the selected memory cell. For example, when an information storage element included in the selected memory cell is in a set state having a crystalline phase, the sensing current $I_S$ may be increased. Conversely, when the information storage element included in the selected memory cell is in a reset state having an amorphous phase, the sensing current $I_S$ may be reduced. A sense amplifier SA of the readout circuit 730 may determine the state of the selected memory cell, by comparing the reading voltage with the reference voltage $V_{REF}$.

As described above, in the actual reading operation, the off-currents $I_{OFF1}$ to $I_{OFF3}$ may be introduced into the word line WL through the second to fourth bit lines BL2 to BL4, which are not selected, and the unselected memory cells. Thus, the total current $I_{TOT}$ obtained by adding the off-currents $I_{OFF1}$ to $I_{OFF3}$ and the sensing current $I_S$ may be input to the readout circuit 730, and the sense amplifier SA may not accurately determine the state of the selected memory cell. In an example embodiment of the present inventive concepts, the leakage current $I_{LEAK}$ corresponding to the off-currents $I_{OFF1}$ to $I_{OFF3}$ may be removed by the bleeding circuit 741, and the first capacitor C1 may be charged by a reading current $I_{RD}$ in which the leakage current $I_{LEAK}$ is removed from the total current $I_{TOT}$ and a reading voltage may be generated.

The current mirror circuit 742 may detect the off-currents $I_{OFF1}$ to $I_{OFF3}$ from the second to fourth bit lines BL2 to BL4, which are unselected bit lines, such that the leakage current $I_{LEAK}$ removed by the bleeding circuit 741 may correspond to the sum of the off-currents $I_{OFF1}$ to $I_{OFF3}$. The current mirror circuit 742 may include a first transistor TR1 connected between a first power node supplying a first power voltage VDD and unselected bit lines, a second transistor TR2 controlled by a control signal such as the first transistor TR1, a third transistor TR3 connected between the second transistor TR2 and a second power node, and the like. The second power node may supply a second power voltage VSS, and the second power voltage may be a negative voltage. Optionally, the current mirror circuit 742 may further include pull-up transistors P1 and P2 connected between the first and second transistors TR1 and TR2 and the first power node, respectively.

The first transistor TR1 may be connected to the non-selection elements LYN1 to LYN4 connected to the bit lines BL1 to BL4. The non-selection elements LYN2 to LYN4 connected to the second to fourth bit lines BL2 to BL4 may be turned-on, such that the current corresponding to the sum of the off-currents $I_{OFF1}$ to $I_{OFF3}$ flowing in the second to fourth bit lines BL2 to BL4 may flow in the first transistor TR1. In detail, the first transistor TR1, an operational amplifier, and the like receiving the off-currents $I_{OFF1}$ to $I_{OFF3}$ from the second to fourth bit lines BL2 to BL4 through the first decoder circuit 710 may provide a circuit for detecting a current corresponding to the sum of the off-currents $I_{OFF1}$ to $I_{OFF3}$.

The current of the first transistor TR1 may be mirrored to the fourth transistor TR4 included in the bleeding circuit 741 via the second transistor TR2 and the third transistor TR3. In other words, the second transistor TR2 and the third transistor TR3 may provide a mirroring circuit. The bleeding circuit 741 may receive the current corresponding to the sum of the off-currents $I_{OFF1}$ to $I_{OFF3}$ from the mirroring circuit and remove the current corresponding to the sum of the off-currents $I_{OFF1}$ to $I_{OFF3}$ as the leakage current $I_{LEAK}$. Alternatively, the bleeding circuit 741 may obtain information on the off-currents $I_{OFF1}$ to $I_{OFF3}$, and determine the magnitude of the current to be removed as the leakage current $I_{LEAK}$, or the like, by referring to the corresponding information. For example, the information on the off-currents $I_{OFF1}$ to $I_{OFF3}$ may be stored in a latch, a memory cell, or the like.

The bleeding circuit 741 may be connected to the first decoder circuit 710 for controlling the bit lines BL1 to BL4 through the current mirror circuit 742. The current mirror circuit 742 may mirror the current corresponding to the sum of the off-currents $I_{OFF1}$ to $I_{OFF3}$ flowing in the second to fourth bit lines BL2 to BL4, which are not selected through the first decoder circuit 741 to transmit the current to the bleeding circuit 741. A gate of the fourth transistor TR4 included in the bleeding circuit 741 may be connected to the first decoder circuit 710 through the current mirror circuit 742, and may be connected especially to the non-selection elements LYN2 to LYN4 of the second to fourth bit lines BL2 to BL4, which are not selected. In an example embodiment illustrated in FIG. 12, while the current mirror circuit 742 is connected to the first decoder circuit 710 to detect the current flowing in the second to fourth bit lines BL2 to BL4, which are not selected, the bleeding circuit 741 may remove some of the currents input to the sense amplifier SA through the word line WL and the second decoder circuit 720. Thus, the first decoder circuit 710 and the second decoder circuit 720 may be connected to each other, by the bleeding circuit 741 and the current mirror circuit 742.

Figure 13:
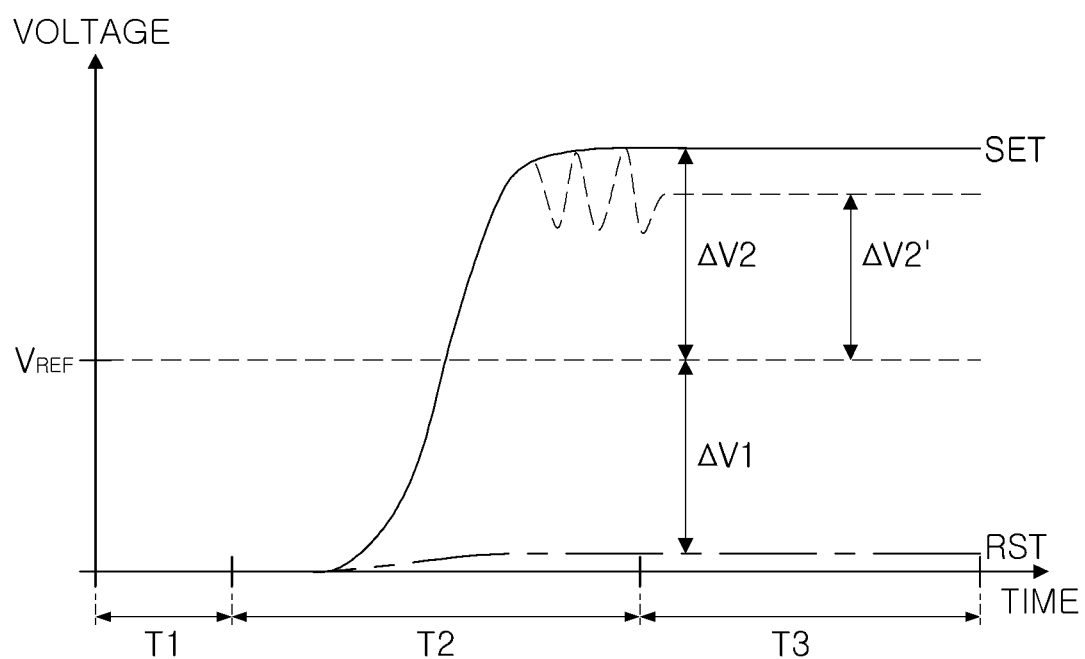
FIG. 13 is a graph illustrating a memory device according to an example embodiment of the present inventive concepts.

FIG. 13 is a graph illustrating a memory device according to an example embodiment of the present inventive concepts.

FIG. 13 may be a graph for comparing an example embodiment in which the current compensation circuit detects the off-currents flowing into the word line through the unselected bit lines and the unselected memory cells to remove the leakage current with an example embodiment removing a leakage current of a certain magnitude regardless of the off-currents. In the graph illustrated in FIG. 13, a first time T1 may be a pre-charge period inputting a bias voltage to the bit lines and the word lines, and a second time T2 may be a development period. On the other hand, a third time T3 may be a sensing period in which a sense amplifier compares the reading voltage with the reference voltage $V_{REF}$.

When the current compensation circuit detects actual off-currents to remove the currents as leakage currents as in an example embodiment of the present inventive concepts, the reading voltage of the selected memory cell in the set state and the reading voltage of the selected memory cell in the reset state may have a first margin ΔV1 and a second margin ΔV2, respectively, with respect to the reference voltage $V_{REF}$. On the other hand, when a leakage current of a certain magnitude is removed, the leakage current may be excessively removed from the sensing current flowing in the selected memory cell in the set state. Thus, a sensing margin ΔV2, which the reading voltage of the selected memory cell in the set state has, may be reduced, and the accuracy of the reading operation may not be improved.

Figure 14:
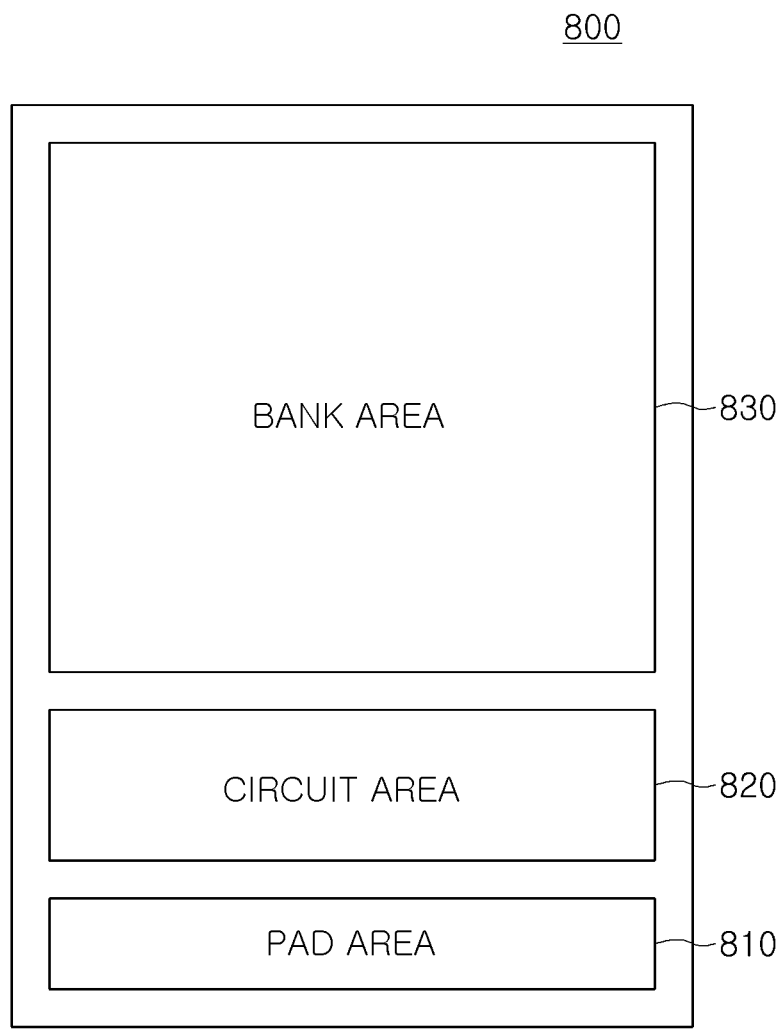
FIG. 14 is a simplified view illustrating architecture of a memory device according to an example embodiment of the present inventive concepts.

FIG. 14 is a diagram briefly illustrating architecture of a memory device according to an example embodiment of the present inventive concepts.

Referring to FIG. 14, a memory device 800 according to an example embodiment of the present inventive concepts may have a pad area 810, a circuit area 820, and a bank area 830. The pad area 810 may be an area in which a plurality of pads for inputting and outputting control signals, data, and the like, and the circuit area 820 may be an area in which various circuits necessary for the operation of the memory device 800 are formed. In the bank area 830, a plurality of banks having memory cells may be formed.

However, although it may be modified according to example embodiments, each of the plurality of banks formed in the bank area 830 may be redivided into a plurality of areas. For example, at least some of the plurality of areas diving each of the plurality of banks may share the decoder circuit, the read/write circuit, or the like, as described above. Hereinafter, it will be described in more detail with reference to FIG. 15.

Figure 15:
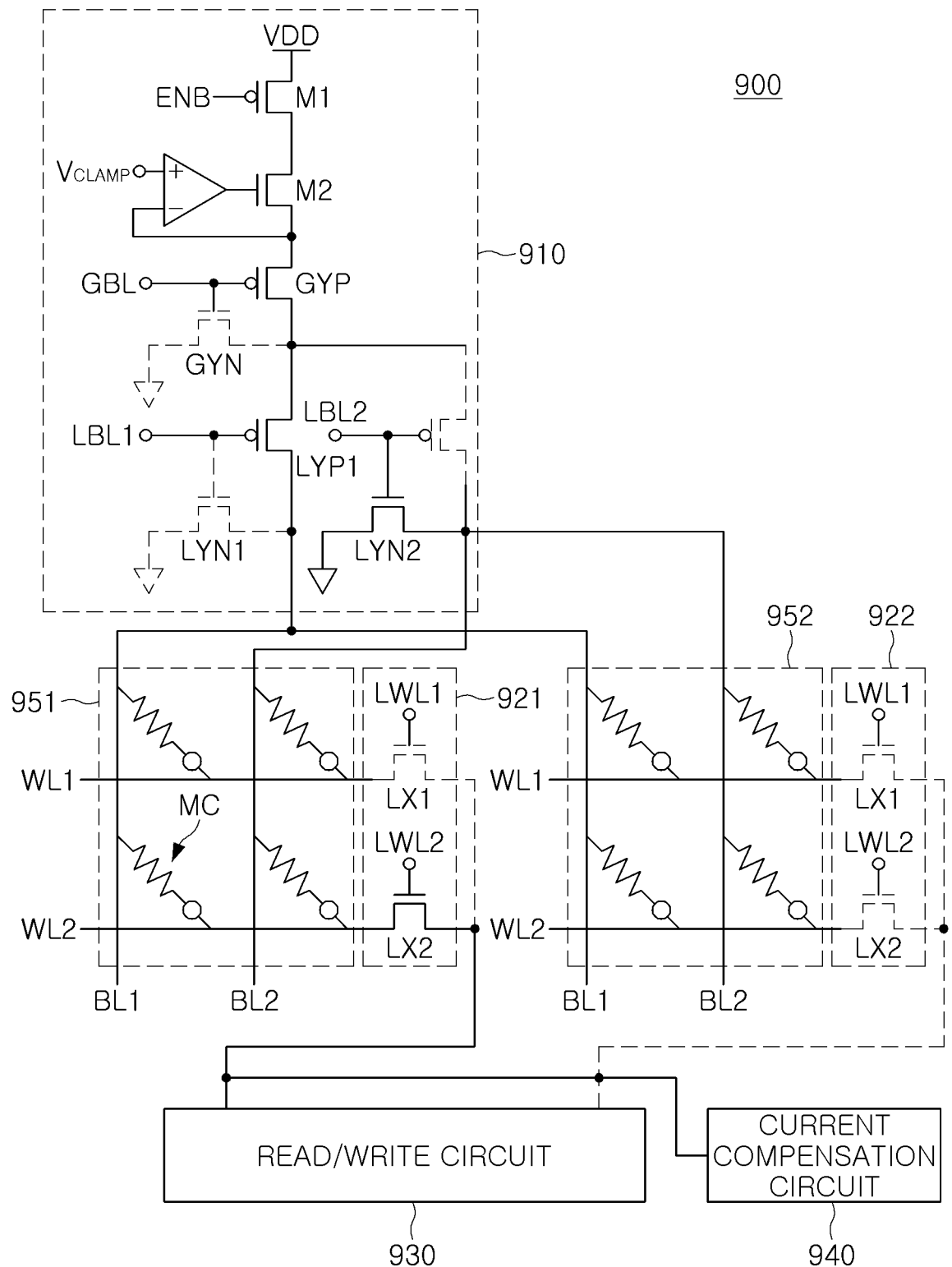
FIG. 15 is a circuit diagram briefly illustrating a memory device according to an example embodiment of the present inventive concepts.

FIG. 15 is a circuit diagram briefly illustrating a memory device according to an example embodiment of the present inventive concepts.

Referring to FIG. 15, a memory device 900 according to an example embodiment of the present inventive concepts may include a first decoder circuit 910, second decoder circuits 921 and 922, a read/write circuit 930, a current compensation circuit 940, and memory cell arrays 951 and 952. The memory cell arrays 951 and 952 may include a plurality of memory cells, and the number of bit lines BL1 to BL2: BL and word lines WL1 to WL2: WL may be variously modified.

In an example embodiment of the present inventive concepts, the bit line BL included in each of the first memory cell array 951 and the second memory cell array 952 may share the first decoder circuit 910. Referring to FIG. 15, a first bit line BL1 of the first memory cell array 951 and a first bit line BL1 of the second memory cell array 952 may share the first selection element LYP1 and the first non-selection element LYN1, and the common selection element GYP and the common non-selection element GYN. Similarly, a second bit line BL2 of the first memory cell array 951 and a second bit line BL2 of the second memory cell array 952 may share the second selection element LYP2 and the second non-selection element LYN2, the common selection element GYP and the common non-selection element GYN. On the other hand, an enable element M1 and a clamp element M2 may also be shared by the bit lines BL included in each of the first memory cell array 951 and the second memory cell array 952.

On the other hand, the second decoder circuits 921 and 922 may not be shared by the word lines WL included in each of the first memory cell array 951 and the second memory cell array 952. Thus, the read/write circuit 930 may perform a read/write operation for one selected memory cell of the memory cells MC included in the first memory cell array 951 and the second memory cell array 952.

For example, assume that a memory cell connected to the first bit line BL1 and the second word line WL2 in the first memory cell array 951 is determined to be a selected memory cell. The first decoder circuit 910 may turn-on the common selection element GYP and the first selection element LYP1 and the second non-selection element LYN2 to input a first voltage to the first bit line BL1. As described above, since the bit lines BL included in each of the first memory cell array 951 and the second memory cell array 952 share the first decoder circuit 910, the first voltage may be simultaneously input to the first bit line BL1 of the first memory cell array 951 and the second memory cell array 952.

The second decoder circuit 921 connected to the first memory cell array 951 may turn-off a first discrete election element LX1 and turn-on a second discrete selection element LX2. In addition, the second decoder circuit 922 connected to the second memory cell array 952 may turn-off both the first and second discrete selection elements LX1 and LX2. In addition, the second decoder circuit 922 connected to the second memory cell array 952 may turn-off both the first and second discrete selection elements LX1 and LX2. Accordingly, the read/write circuit 930 may specify a memory cell connected to the first bit line BL1 and the second word line WL2 in the first memory cell array 951 as a selected memory cell and perform the read/write operation, or the like.

When the read/write circuit 930 performs a reading operation for the selected memory cell, a current compensation circuit 940 may remove at least a portion of the currents input to the read/write circuit 930 as a leakage current. For example, the current compensation circuit 940 may detect the current flowing from the second bit line BL2 of the first memory cell array 951 to the second word line WL2 to remove the current as a leakage current. The current compensation circuit 940 may include a bleeding element for drawing a portion of the currents input to the read/write circuit 930.

Figure 16:
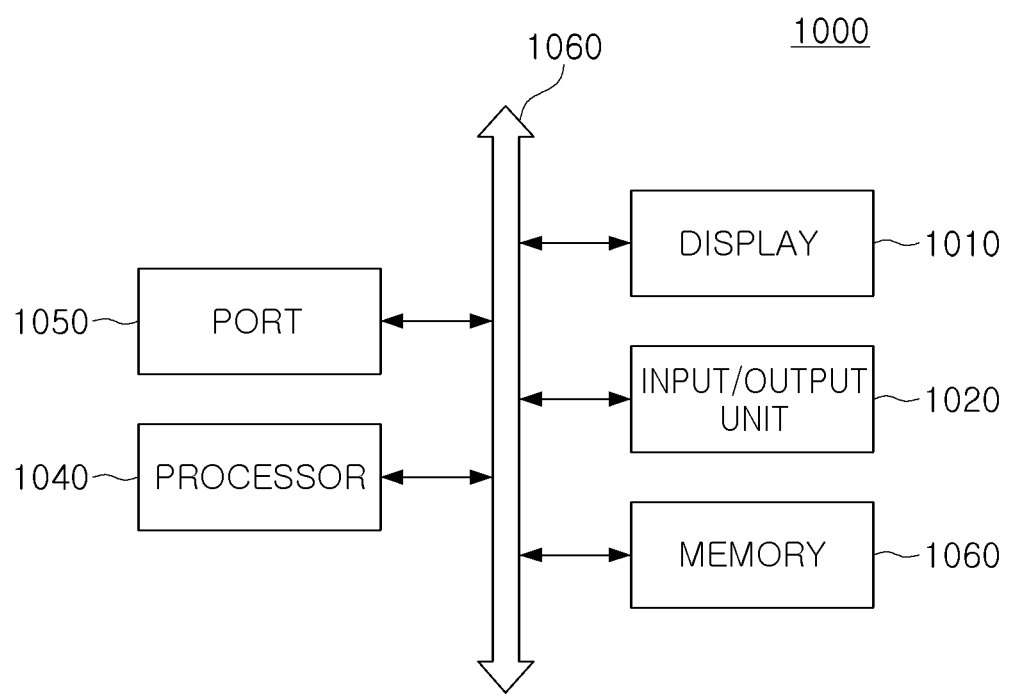
FIG. 16 is a block diagram briefly illustrating an electronic apparatus including a memory device according to an example embodiment of the present inventive concepts.

FIG. 16 is a block diagram briefly illustrating an electronic device including a memory device according to an example embodiment of the present inventive concepts.

Referring to FIG. 16, a computer device 1000 may include a display 1010, an input/output unit 1020, a memory 1060, a processor 1040, a port 1050, and the like. In addition, the computer device 1000 may further include a wired/wireless communication device, a power supply device, and the like. The port 1050 may be a device provided for communicating with a video card, a sound card, a memory card, a USB device, and the like. The computer device 1000 may be smartphones, tablet PCs, smart wearable devices, and the like as well as common desktop computers or laptop computers.

The processor 1040 may perform specific operations or commands, tasks, and the like. The processor 1040 may be a central processing unit CPU or a microprocessor unit MCU, a system on chip SoC, or the like, and the processor 1040 may communicate with the display 1010, the input/output unit 1020, the memory device 1060, as well as other devices connected to the port 1050 via the bus 1060.

The memory 1060 may be a storage medium storing data necessary for the operation of the computer device 1000, multimedia data, or the like. The memory 1060 may include a volatile memory such as a random access memory RAM or a non-volatile memory such as a flash memory, or the like. In addition, the memory 1060 may include at least one of a solid state drive SSD, a hard disk drive HDD, and an optical disk drive ODD as a storage device. The input/output unit 1020 may include an input device such as a keyboard, a mouse, a touch screen, or the like and an output device such as a display, an audio output unit, or the like, provided to an user.

The memory 1060 may include a phase-change memory device which records/erases and reads data using the change in resistance of the phase-change material. In addition, in an example embodiment illustrated in FIG. 16, the memory 1060 may include a memory device according to various example embodiments described above with reference FIGS. 1 to 15.

As set forth above, according to an example embodiment of the present inventive concepts, when a reading operation is performed by connecting a selected memory cell to read data to a readout circuit, a leakage current flowing in unselected memory cells connected a word line such as a selected memory cell is detected and the leakage current may be removed from an input terminal of the readout circuit. Thus, the accuracy of the reading operation may be improved by significantly reducing a change in the sensing margin due to the leakage current.

The various advantages and effects of example embodiments are not limited to the above description, and can be more easily understood in the course of describing a specific example embodiments.

While example embodiments have been shown and described above, it will be apparent to those skilled in the art that modifications and variations could be made without departing from the scope of the present inventive concepts as defined by the appended claims.

What is claimed is:

1. A memory device comprising:
    a plurality of memory cells connected to a plurality of word lines and a plurality of bit lines, each of the plurality of memory cells including a switching element and an information storage element connected to the switching element, the information storage element storing data based on a resistance change;
    a decoder circuit configured to read data from a selected memory cell among the plurality of memory cells, the selected memory cell being connected to a selected word line of the plurality of word lines and a selected bit line of the plurality of bit lines; and
    a current compensation circuit configured to remove a leakage current from the selected word line, the leakage current being based on off-currents flowing in at least one of unselected bit lines excluding the selected bit line, among the plurality of bit lines.

2. The memory device of claim 1, further comprising:
    a sense amplifier including a first input terminal and a second input terminal, the first input terminal being connected to the selected word line, the first input terminal configured to receive a sensing voltage corresponding to a state of the selected memory cell and the second input terminal configured to receive a reference voltage.

3. The memory device of claim 2, wherein the current compensation circuit comprises:
    a current mirror circuit configured to detect the off-currents, and to mirror the leakage current to generate a mirrored leakage current; and
    a bleeding element connected to the first input terminal, the bleeding element configured to remove the leakage current from the selected word line based on the mirrored leakage current.

4. The memory device of claim 1, wherein the decoder circuit comprises:
    a clamp circuit configured to charge the selected bit line and the selected word line for a first time period, and wherein
        the current compensation circuit is configured to remove the off-currents from the selected word line for a second time period, the second time period being subsequent to the first time period.

5. The memory device of claim 4, wherein the decoder circuit is configured to connect the selected word line to a current path provided by the current compensation circuit for the second time period.

6. The memory device of claim 1, wherein the information storage element comprises a phase-change material.

7. The memory device of claim 1, wherein:
    the information storage element in each of the plurality of memory cells is connected to a respective one of the plurality of bit lines, and
    the switching element in each of the plurality of memory cells is connected to a respective one of the plurality of word lines.

8. The memory device of claim 1, wherein the decoder circuit is configured to,
    input a first voltage to the selected bit line,
    input a second voltage to the selected word line, the second voltage being lower than the first voltage, and
    inputs a third voltage to the at least one of unselected bit lines, the third voltage being lower than the first voltage and higher than the second voltage.

9. The memory device of claim 8, wherein the second voltage is a negative voltage.

10. The memory device of claim 8, wherein a difference between the first voltage and the third voltage is substantially equal to a difference between the second voltage and the third voltage.

11. A memory device comprising:
   a plurality of memory cells connected to a plurality of bit lines and a plurality of word lines;
   a first decoder circuit configured to determine a selected bit line and unselected bit lines among the plurality of bit lines;
   a second decoder circuit configured to determine a selected word line and unselected word lines among the plurality of word lines;
   a sense amplifier including an input terminal connected to the selected word line; and
   a current compensation circuit including,
      a first transistor connected between a first power node and at least one of the unselected bit lines,
      a second transistor connected to the first power node, the second transistor controlled by a same control signal as the first transistor,
      a third transistor connected between the second transistor and a second power node, and
      a fourth transistor connected between the input terminal of the sense amplifier and the second power node, the fourth transistor configured to mirror a current of the third transistor.

12. The memory device of claim 11, wherein
   the first transistor and the second transistor are PMOS transistors, and
   the third transistor and the fourth transistor are NMOS transistors.

13. The memory device of claim 11, wherein the first transistor and the second transistor are controlled by a clamp circuit, the clamp circuit configured to output a voltage equal to a voltage input to the at least one of the unselected bit lines.

14. The memory device of claim 11, wherein the fourth transistor is configured to remove, from the selected word line, a current of a same magnitude as the current of the third transistor.

15. The memory device of claim 14, wherein the current of the third transistor corresponds to current flowing from the at least one of the unselected bit lines to the selected word line.

16. A memory device comprising:
   a plurality of memory cells connected to a plurality of bit lines and a plurality of word lines, the plurality of bit lines including a selected bit line and unselected bit lines excluding the selected bit line;
   a decoder circuit configured to precharge a selected word line among the plurality of word lines for a first time period, and to connect the selected word line to a current path for a second time period, subsequent to the first time period;
   a bleeding circuit configured to provide the current path drawing a leakage current from the selected word line for the second time period, the leakage current corresponding to off-current flowing in at least one of the unselected bit lines; and
   a sense amplifier configured to compare a sensing voltage detected through the selected word line with a reference voltage for a third time period, the third time period being subsequent to the second time period.

17. The memory device of claim 16, wherein the off-current is current flowing from the at least one of the unselected bit lines to the selected word line.

18. The memory device of claim 16, wherein each of the plurality of memory cells comprises:
   an information storage element including a phase-change material; and
   a switching element.

19. The memory device of claim 18, wherein each of the plurality of memory cells is set to one of a set state and a reset state, the set state being a state in which the phase-change material of the information storage element is crystalline, and the reset state being a state in which the phase-change material of the information storage element is amorphous.

20. The memory device of claim 19, wherein
   the selected bit line and the selected word line are connected to a selected memory cell, and
   a current flowing in the selected memory cell is lower than the leakage current, when the selected memory cell is in the reset state.

* * * * *